(12) United States Patent
Suzuki et al.

(10) Patent No.: US 7,231,192 B2
(45) Date of Patent: Jun. 12, 2007

(54) HIGH FREQUENCY RECEIVER

(75) Inventors: Masanori Suzuki, Ichinomiya (JP); Koji Nakatsuji, Gifu (JP); Sanae Asayama, Nagoya (JP); Atsuhito Terao, Gifu (JP); Kazutoshi Sato, Inazawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 498 days.

(21) Appl. No.: 10/695,825

(22) Filed: Oct. 30, 2003

(65) Prior Publication Data
US 2004/0130666 A1 Jul. 8, 2004

(30) Foreign Application Priority Data
Oct. 31, 2002 (JP) ............................. 2002-318200

(51) Int. Cl.
H04B 1/26 (2006.01)
H04B 15/00 (2006.01)

(52) U.S. Cl. ............... 455/130; 455/318; 455/324; 455/326; 455/339; 348/725; 348/729; 348/731

(58) Field of Classification Search ............... 455/284, 455/285, 3.02, 296, 302, 305, 313–326; 348/729, 348/731
See application file for complete search history.

(56) References Cited

U.S. PATENT DOCUMENTS

| | | | |
|---|---|---|---|
| 5,737,035 A * | 4/1998 | Rotzoll ....................... | 348/725 |
| 5,758,276 A | 5/1998 | Shirakawa et al. | |
| 5,852,772 A | 12/1998 | Lampe et al. | |
| 5,870,670 A * | 2/1999 | Ripley et al. ............... | 455/304 |
| 6,594,477 B1 * | 7/2003 | Kitaguchi ................... | 455/314 |
| 6,714,776 B1 * | 3/2004 | Birleson ..................... | 455/302 |
| 7,079,195 B1 * | 7/2006 | Birleson et al. ............ | 348/725 |
| 7,092,043 B2 * | 8/2006 | Vorenkamp et al. ........ | 348/726 |
| 2003/0025841 A1 * | 2/2003 | Sawyer ....................... | 348/734 |
| 2004/0002323 A1 * | 1/2004 | Zheng ........................ | 455/324 |
| 2005/0096004 A1 * | 5/2005 | Tso et al. .................... | 455/334 |

FOREIGN PATENT DOCUMENTS

EP 1 195 889 A2 4/2002
JP 7-297682 11/1995

OTHER PUBLICATIONS

Baumberger, Werner, "A Single-Chip Image Rejecting Receiver for the 2.44 GHz Band Using Commercial GaAs-MESFET-Technology", *IEEE*, vol. 29, No. 10, Oct. 1994, pp. 1244-1249.

* cited by examiner

*Primary Examiner*—Simon Nguyen
(74) *Attorney, Agent, or Firm*—Wenderoth, Lind & Ponack, L.L.P.

(57) ABSTRACT

A high frequency receiver of the present invention has a mixer of which one input part is connected to an output part of a filter and the other input part is connected to an output part of a frequency-variable local oscillator, and an output terminal connected to an output part of the mixer. The mixer is an image rejection mixer. The filter has a moderated damping characteristic in a frequency where the image rejection mixer reduces an image. Therefore, a high performance filter is not required, and hence a low price is realized.

26 Claims, 20 Drawing Sheets

Fig. 1
23: second filter
24: unbalanced/balanced convertor
25: image rejection mixer
29: phase shifter
31: balanced/unbalanced convertor
32: intermediate frequency filter 23: second filter
24: unbalanced/balanced convertor
25: image rejection mixer
29: phase shifter
31: balanced/unbalanced convertor
32: intermediate frequency filter FIG. 9
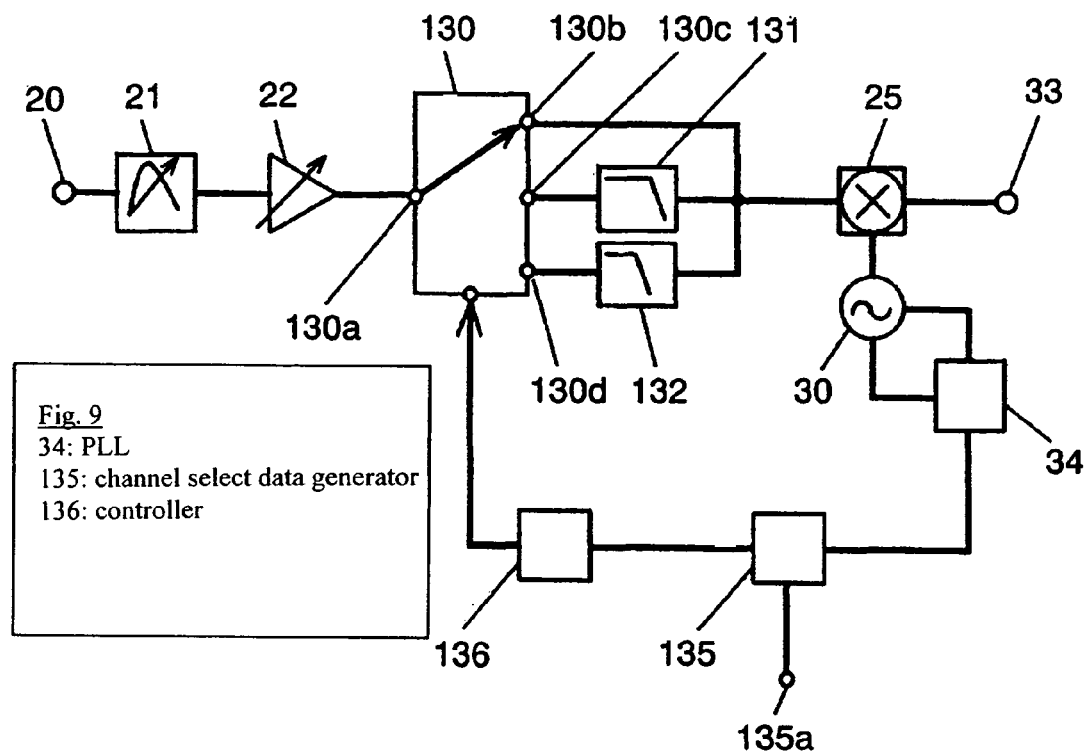
Fig. 9
34: PLL
135: channel select data generator
136: controller
FIG. 10
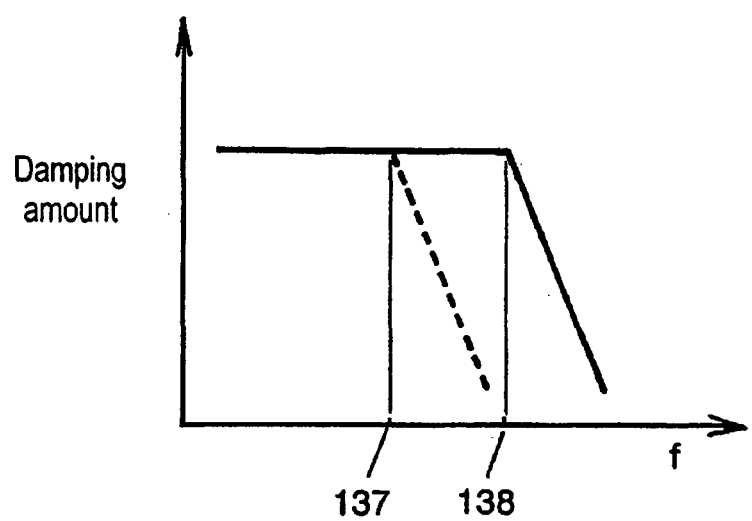

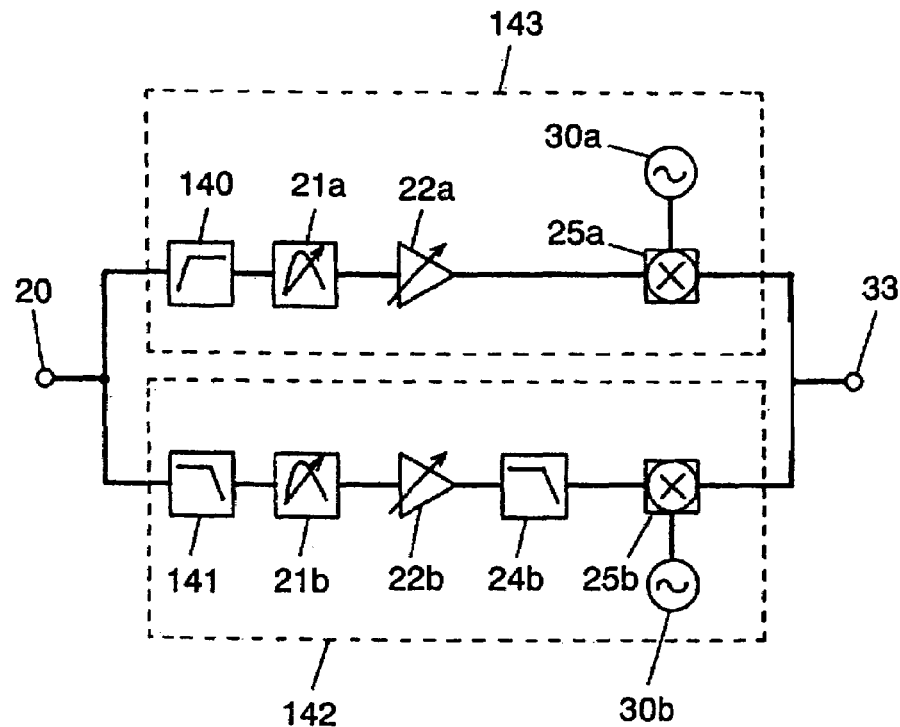
FIG. 11
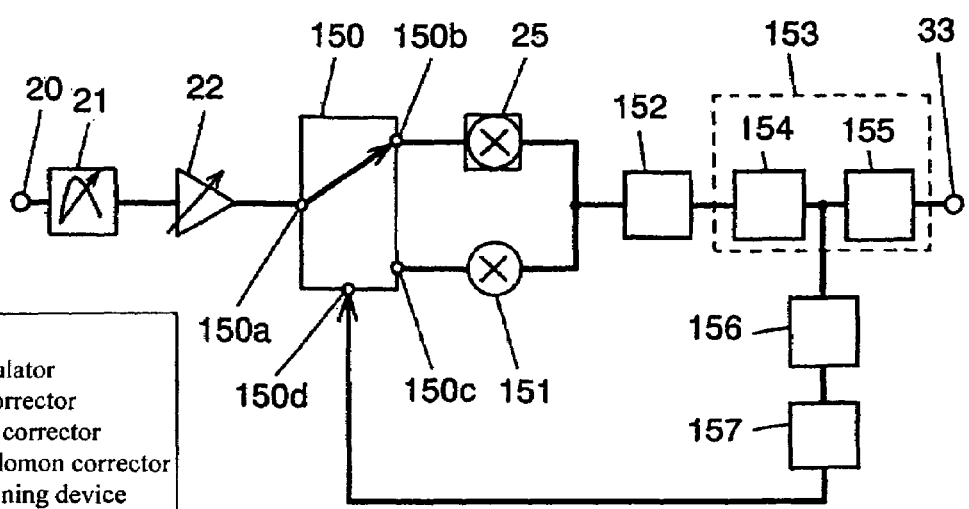
FIG. 12
Fig. 12
152: demodulator
153: error corrector
154: Viterbi corrector
155: reed solomon corrector
156: determining device
157: controller FIG. 13
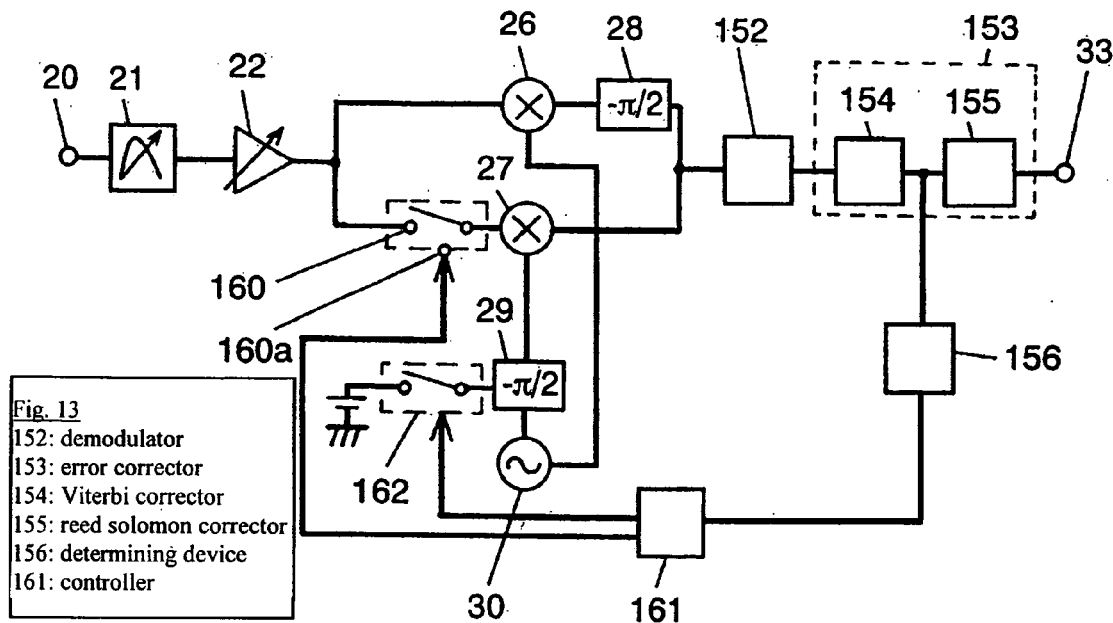
Fig. 13
152: demodulator
153: error corrector
154: Viterbi corrector
155: reed solomon corrector
156: determining device
161: controller
FIG. 14
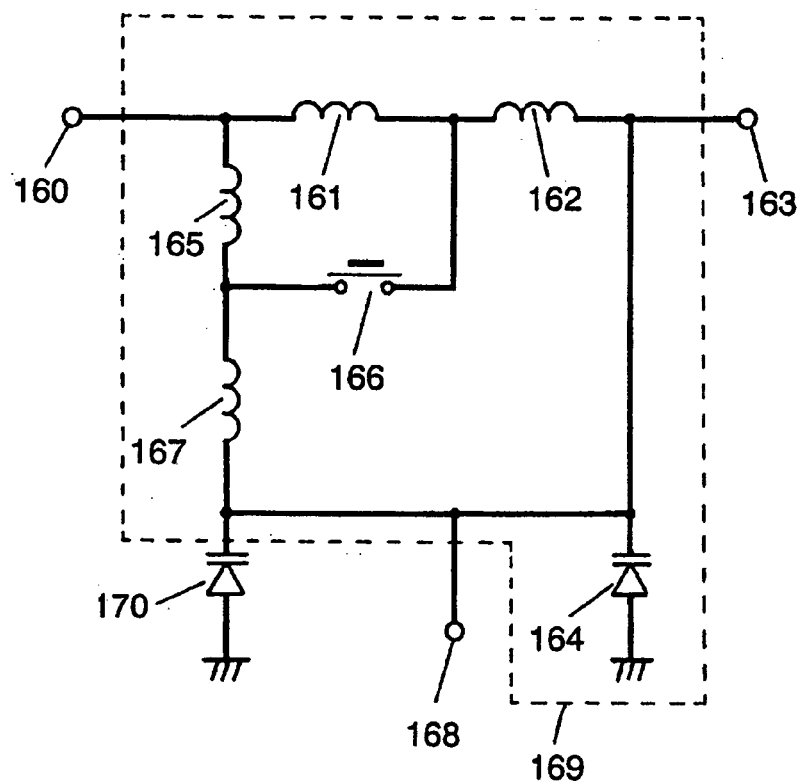

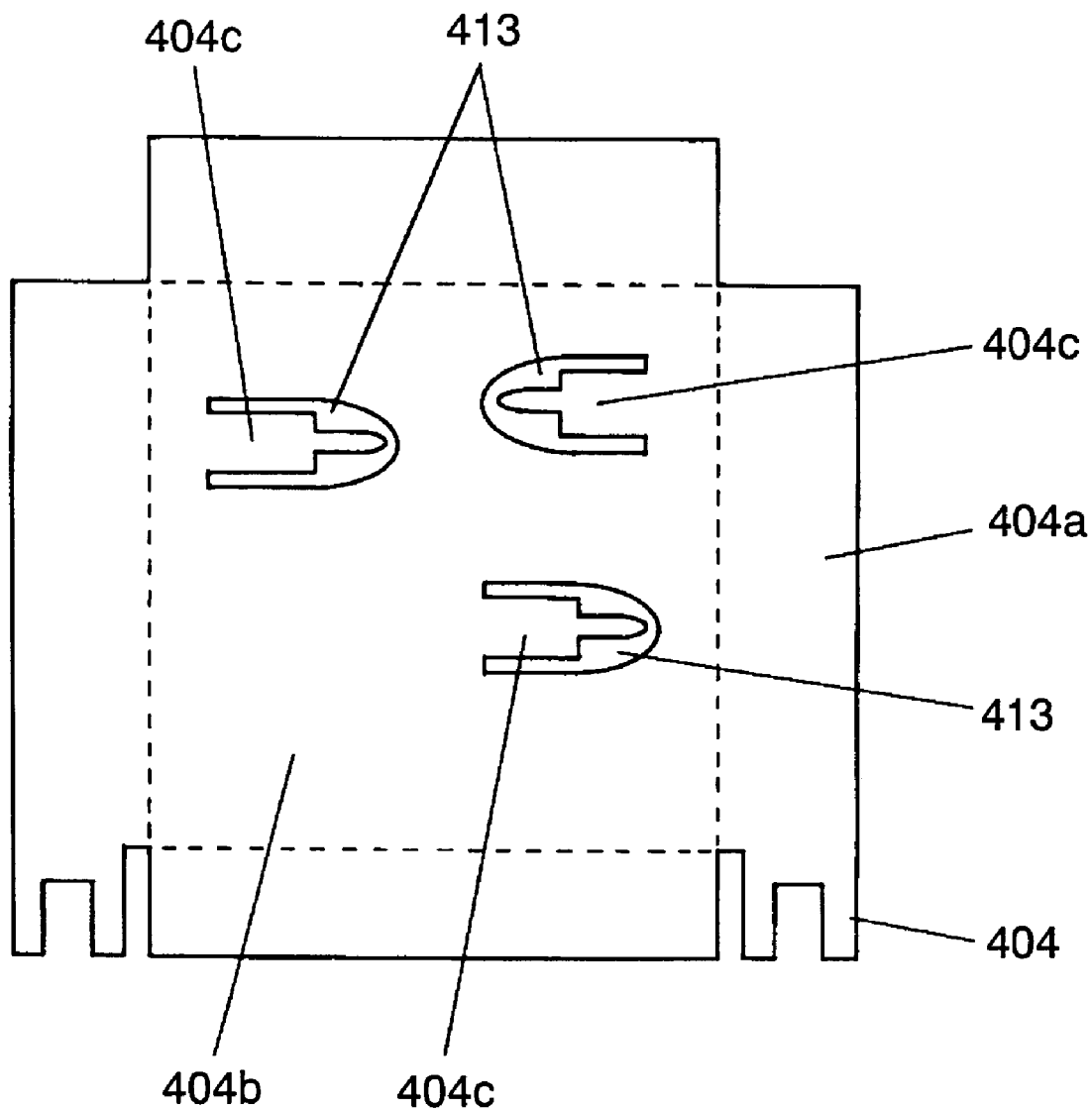

7: band-pass filter

HIGH FREQUENCY RECEIVER

BACKGROUND OF THE INVENTION

1. Field of the Invention

The present invention relates to a high frequency receiver for receiving a broadband high frequency signal.

2. Background Art

A conventional tuner will be described hereinafter with reference to a drawing. FIG. 26 is a schematic block diagram of the conventional tuner.

In FIG. 26, a high frequency signal of about 50 to 860 MHz is fed into input terminal 1.

Antenna filter 2 connected to input terminal 1 is a single tuning filter. Tuned frequency by antenna filter 2 is tuned to a frequency of a received channel, and an undesired frequency is removed. High-frequency amplifier 3 is connected to an output part of antenna filter 2 and amplifies the high frequency signal.

An output part of high frequency amplifier 3 is connected to step-to-step filter 4. Step-to-step filter 4 is a double tuning filter.

Mixer 5 is a double balanced mixer, and one input part thereof is connected to the output part of step-to-step filter 4 and the other input part is connected to the output part of frequency-variable local oscillator 6. Mixer 5 converts the frequency of a signal to a predetermined intermediate frequency (IF).

Band-pass filter 7 receives an output from mixer 5, and removes signals other than a desired signal. An output from band-pass filter 7 is supplied to output terminal 8.

Japanese Patent Examined Publication No. H7-297682, for example, is known as prior art information related to the present invention.

The frequency conversion by a mixer generally generates an image interfering signal, so that an image (this is simply called an image) for generating the image interfering signal must be previously suppressed with a filter on the upstream side of the mixer. The conventional high frequency receiver therefore increases a damping amount of the image with respect to frequency, using a filter having a high-performance damping characteristic in a two-stage structure of a single tuning filter and a double tuning filter.

The conventional high frequency receiver requires two filters, namely one double tuning filter having two tuning circuits and one single tuning filter, so that the receiver is expensive.

SUMMARY OF THE INVENTION

The present invention provides a high frequency receiver having the following elements:
- an input terminal for receiving a high frequency signal;
- a filter connected to the input terminal;
- a mixer of which one input part is connected to, an output part of the filter and the other input part is connected to an output part of a frequency-variable local oscillator; and
- an output terminal connected to an output part of the mixer.

The mixer is an image rejection mixer. The filter has a moderated damping characteristic at a frequency where the image rejection mixer reduces the image.

BRIEF DESCRIPTION OF THE DRAWINGS

FIG. 9 is a block diagram of a high frequency receiver in accordance with exemplary embodiment 3 of the present invention.

FIG. 10 is a characteristic diagram of a low-pass filter in accordance with exemplary embodiment 3.

FIG. 11 is a block diagram of a high frequency receiver in accordance with exemplary embodiment 4 of the present invention.

FIG. 12 is a block diagram of a high frequency receiver in accordance with exemplary embodiment 5 of the present invention.

FIG. 13 is a block diagram of a high frequency receiver in accordance with exemplary embodiment 6 of the present invention.

FIG. 14 is a circuit diagram of an input filter in accordance with exemplary embodiment 7 of the present invention.

FIG. 24 is an expanded view of a shield case of the high frequency receiver in accordance with exemplary embodiment 9.

DETAILED DESCRIPTION OF THE INVENTION

EXEMPLARY EMBODIMENT 1

Figure 1:
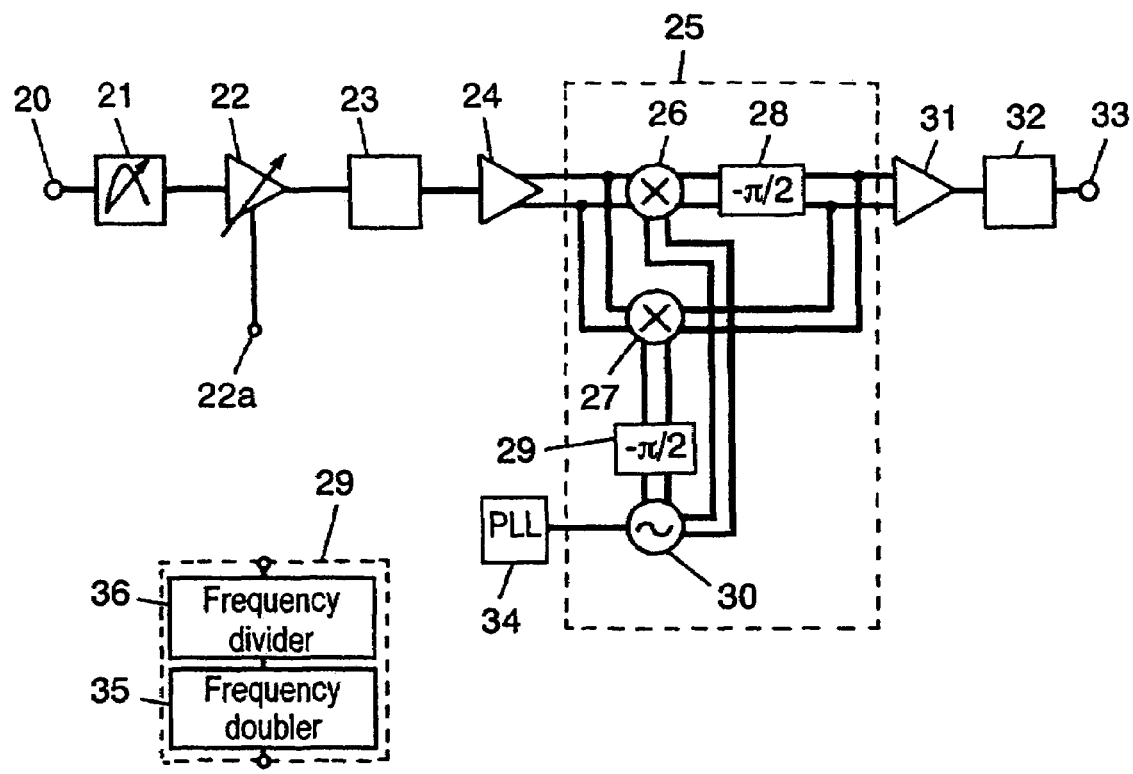
FIG. 1 is a block diagram of a high frequency receiver in accordance with exemplary embodiment 1 of the present invention.

Exemplary embodiment 1 of the present invention will be hereinafter described with reference to the drawings. FIG. 1 is a block diagram of a high frequency receiver in accordance with exemplary embodiment 1.

In FIG. 1, input terminal 20 receives a high frequency signal of a television broadcast of about 50 to 860 MHz.

Input filter 21 is connected to input terminal 20. In Exemplary embodiment 1, input filter 21 is formed of a circuit having only one set of tuning circuits where an inductance and a variable capacitance diode are connected in parallel. This circuit is hereinafter called a single tuning circuit. Tuned frequency of input filter 21 is varied by changing voltage applied to the variable capacitance diode. When the high frequency receiver receives a desired channel, voltage is applied to the variable capacitance diode so that the tuned frequency of input filter 21 substantially equals the frequency of the desired channel. Signals other than the signal in the desired channel can thus be damped.

High frequency amplifier 22 is connected to an output part of input filter 21, and amplifies high frequency signals having passed through input filter 21. High frequency amplifier 22 is a variable gain amplifier capable of varying gain with a control voltage applied to control terminal 22a.

High frequency amplifier 22 is thus disposed, so that the high frequency receiver can have high noise figure (NF) in a system even when a device having low NF is used downstream. Since input filter 21 is disposed upstream of high frequency amplifier 22, undesired signals inputted into high frequency amplifier 22 can be removed.

It is important that an input level of signals fed into high frequency amplifier 22 is set at a level for preventing saturation of high frequency amplifier 22. Signals with a high level causing the saturation of high frequency amplifier 22 distort, and undesired signals such as higher harmonic waves occur in high frequency amplifier 22. Therefore, it is important that signals other than the desired signal are damped to a level where high frequency amplifier 22 does not saturate. Since input filter 21 is a single tuning circuit, damping characteristics of both upside frequency and downside frequency of the tuned frequency are obtained.

Fixed filter 23 is a second filter connected to the output part of high frequency amplifier 22. Second filter 23 has a natural cutoff frequency determined based on a fixed inductance and a fixed capacitance. Second filter 23 is a low-pass filter and has a cutoff frequency of about 349 MHz in embodiment 1.

The output part of the second filter is connected to unbalanced/balanced converter 24, and converts an unbalanced circuit to a balanced circuit. When all circuits are essentially formed of balanced circuits and connected in a balanced state, immunity against interruption or the like of an interfering signal from the outside can be improved. For balancing input filter 21 and second filter 23, two sets of the filters are required for each of the filters. However, the circuits keep balance hardly and become expensive when a discrete configuration is employed, so that a part after second filter 23 is converted to a balanced circuit.

The output part of unbalanced/balanced converter 24 is connected to image rejection mixer (IRM) 25, and is formed of a balanced circuit. IRM 25 is formed of two sets of double balanced mixers (DBMs) 26, 27 and two sets of phase shifters 28, 29. The mixer is formed of the balanced circuit, so that a distortion characteristic of the mixer can be improved and interference hardly occurs in the mixer.

In IRM 25, the output part of unbalanced/balanced converter 24 is firstly divided into two. One output part of unbalanced/balanced converter 24 is connected to one input part of DBM 26, and an output part of frequency-variable local oscillator 30 is connected to the other input part of DBM 26. The output part of DBM 26 is connected to phase shifter 28.

The other output part of unbalanced/balanced converter 24 is connected to one input part of DBM 27, and the other input part of DBM 27 is connected to another output part of frequency-variable local oscillator 30 via phase shifter 29. An output of DBM 27 and an output of phase shifter 28 are combined.

Phase shifter 28 and phase shifter 29 change phases of signals inputted into these phase shifters by 90°. Phase shifter 29 delays the phase of an oscillation frequency signal of frequency-variable local oscillator 30 by 90° so that the phase of a signal having an intermediate frequency as the output of DBM 27 delays by 90°. Phase shifter 28 delays the phase of a signal having an intermediate frequency supplied from DBM 26 by 90°.

IRM 25 having such a configuration mixes an output signal of frequency-variable local oscillator 30 and a signal of a desired channel, and frequency-converts the signal of the desired channel to an intermediate frequency signal having 45.75 MHz. Frequency-variable local oscillator 30 of embodiment 1 is of the upper heterodyne type where oscillation frequency of oscillator 30 is higher than the frequency of the desired channel signal by the frequency (this is hereinafter called intermediate frequency) of the intermediate frequency signal.

Balanced/unbalanced converter 31 is disposed so as to receive a combined signal of an output of phase shifter 28 and an output of DBM 27. Balanced/unbalanced converter 31 converts the circuit to the unbalanced circuit. The output part of the balanced/unbalanced converter 31 is connected to intermediate frequency filter 32. In embodiment 1, the center of the passing band of intermediate frequency filter 32 is substantially intermediate frequency, and filter 32 damps a signal having a frequency separated from the intermediate frequency by 3 MHz or higher. The frequency of 3 MHz is a half of the frequency band of 6 MHz of substantially one channel.

Intermediate frequency filter 32 is unbalanced, so that balanced/unbalanced converter 31 is disposed before filter 32. The output part of filter 32 is connected to output terminal 33. Intermediate frequency filter 32 may be balanced for improving the distortion characteristic, and in this case balanced/unbalanced converter 31 is operated as a buffer circuit. Phase locked loop (PLL) circuit 34 is loop-connected to frequency-variable local oscillator 30.

Since the oscillation frequency of oscillator 30 depends on the frequency of the desired channel signal in embodiment 1, phase shifter 29 must have enough accuracy to stably shift the phase in a wide frequency band. Phase shifter 29 is a so-called flip-flop type phase shifter. This shifter includes frequency doubler 35 for multiplying the signal of frequency-variable local oscillator 30, and frequency divider 36 connected to the output part of frequency doubler 35. Frequency divider 36 returns the output frequency of frequency doubler 35 to the original oscillation frequency. At this time, the phase of an input signal to DBM 27 can be shifted by 90°.

Phase shifter 28 is simply required to shift the phase only of intermediate frequency. Therefore, a polyphase type phase shifter having a high phase change accuracy of the frequency at a certain point is employed to shift the phase of the output signal of DBM 26 by 90°.

Figure 2:
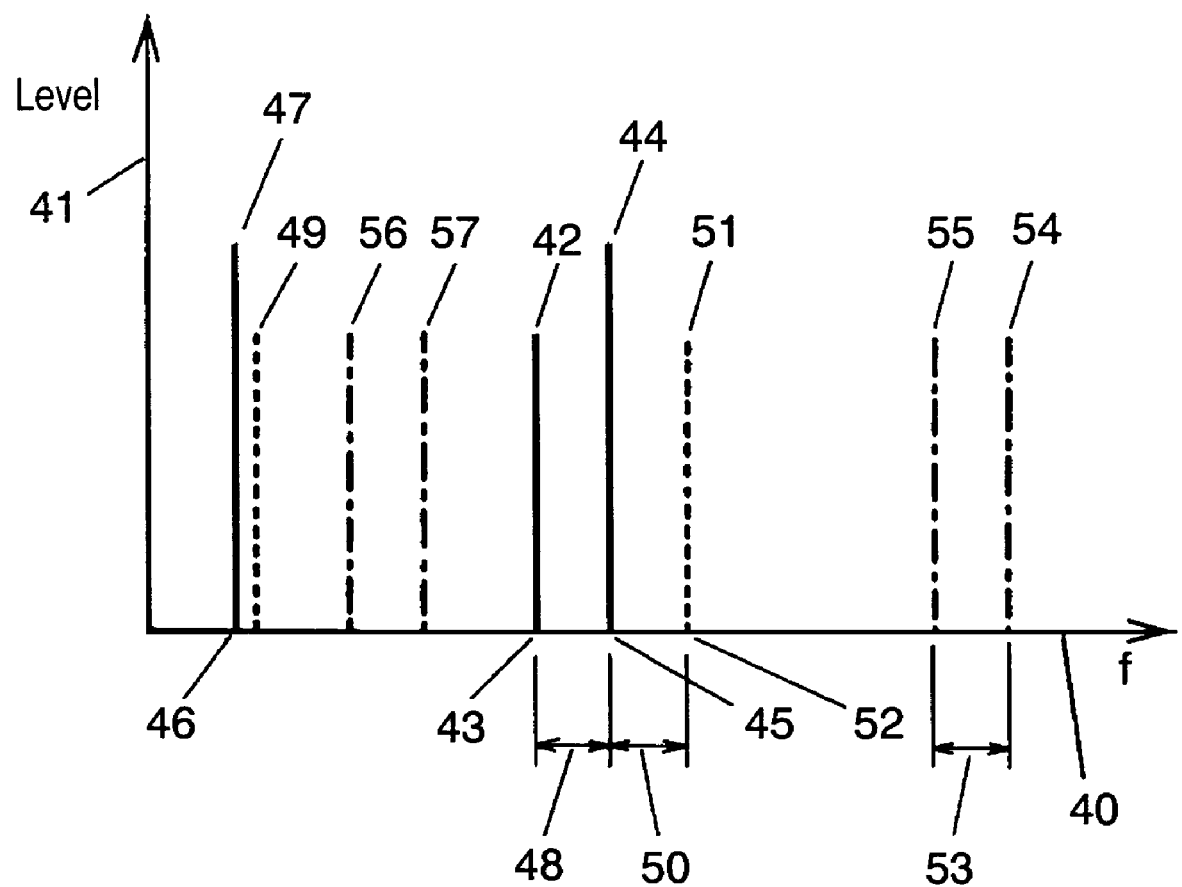
FIG. 2 is a schematic diagram showing a relation of frequencies and signals in accordance with exemplary embodiment 1.

Next, a mechanism for generating image interference and an operation for suppressing the image interference with the IRM used in the high frequency receiver of embodiment 1 are described with reference to the drawings. FIG. 2 is a schematic diagram showing a relation between frequencies and signals. FIG. 3A, FIG. 3B, FIG. 3C and FIG. 3D show respective relations between desired signals and image interfering signals in the IRM of exemplary embodiment 1.

In FIG. 2, horizontal axis 40 shows frequency and vertical axis 41 shows level. An example where the second channel of a television broadcast in the United States of America is described. Frequency 43 of signal 42 of the desired channel is about 55.25 MHz. Oscillation frequency 45 of oscillation signal 44 of frequency-variable local oscillator 30 is frequency difference 48 higher than frequency 43 of the signal of the desired channel. In this case, frequency 46 of intermediate frequency signal 47 is 45.75 MHz, so that frequency of oscillation frequency 45 is 101 MHz. A mixer mixes oscillation signal 44 having oscillation frequency 45 and desired channel signal 42 having frequency 43, and outputs a signal having intermediate frequency 46 equal to frequency difference 48 between oscillation signal 44 and desired channel signal 42.

Occurrence of image interfering signal 49 is now described. Image interfering signal 49 occurs when an unnecessary signal exists in signals fed into the mixer. Here, for example, the unnecessary signal is a signal that is mixed with the signal of frequency-variable local oscillator 30 and converted into the same frequency as that of intermediate frequency signal 47 by the mixer. In other words, the mixer outputs a frequency difference between two inputted frequencies, so that a signal having frequency image 50 higher than oscillation frequency 45 by frequency difference 48 is converted into the intermediate frequency. Here, frequency difference 48 is a difference between desired channel signal 42 and the signal of oscillator 30.

A signal that is converted by the mixer and generates image interfering signal 49 having the same frequency as intermediate frequency 46 is called image 51, wherein frequency 52 of image 51 in embodiment 1 is 146.75 MHz.

Image 51 is generated in three cases:
  a broadcast signal itself existing on or near frequency 52 becomes image 51;
  image 51 is generated from a plurality of broadcast signals 54, 55 that have a frequency higher than frequency 52 of image 51 and between which frequency difference 53 equals to frequency 52 of image 51; and inversely,
  image 51 is generated from a plurality of broadcast signals 56, 57 that have a frequency lower than frequency 52 of image 51 and of which frequencies are summed into a value equal to frequency 52 of image 51.

Additionally, a case where sum of or difference between frequencies of three or more broadcast signals equals to frequency 52 of image 51 is also considered. These image interferences cause problems in a high frequency receiver. The high frequency receiver is, for example, an electronic tuner for receiving the television broadcast that converts a desired channel signal into intermediate frequency 46 lower than oscillation frequency 45 and has a wide received frequency band.

Next, an operation of the IRM of embodiment 1 for suppressing image 51 generated by the mixer is hereinafter described with reference to the drawings. FIG. 3A, FIG. 3B, FIG. 3C and FIG. 3D show respective phase relations of desired signals and image interfering signals in the IRM of embodiment 1.

Figure 3A:
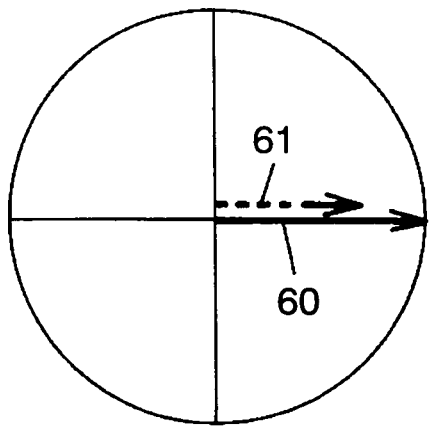
FIG. 3A, FIG. 3B, FIG. 3C and FIG. 3D show respective phase relations between desired signals and image interfering signals in accordance with exemplary embodiment 1.

FIG. 3A shows phases of output signals supplied from DBM 26. DBM 26 simply converts frequency, and hence desired channel signal 60 and image interfering signal 61 have the same phase.

Figure 3D:
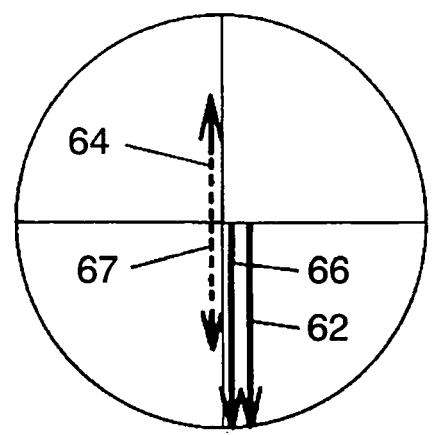
Figure 3B:
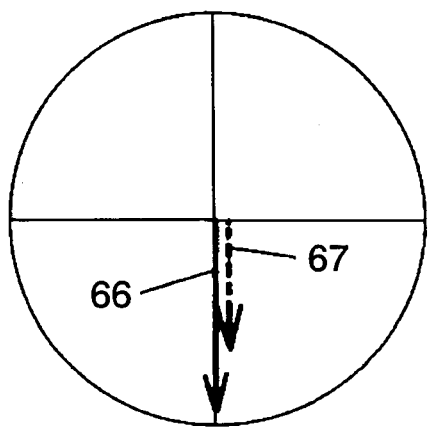

FIG. 3B shows phases of intermediate frequency signal 66 and image interfering signal 67 in the output signals of phase shifter 28. Phase shifter 28 delays phases of the outputs of DBM 26 by 90° and delays both phases of intermediate frequency signal 66 and image interfering signal 67 by 90°.

Figure 3C:
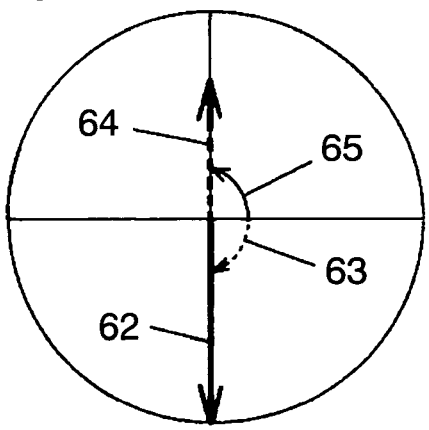

FIG. 3C shows phases of output signals supplied from DBM 27. When DBM 27 mixes a signal of which phase is delayed by 90° by phase shifter 29 and the desired channel signal, phase 63 of intermediate frequency signal 62 outputted from DBM 27 is delayed by 90°.

Image 50 mixed with oscillation frequency 45 by DBM 27 inverses frequency relation between the desired channel signal and the oscillation signal, so that the phase of image interfering signal 64 in the output of DBM 27 shifts in the direction opposite to intermediate frequency signal 62. Phase 65 of image interfering signal 64 is advanced by 90°.

FIG. 3D shows a combined state of the output signals of DBM 27 and the output signals of phase shifter 28. The combined signals are supplied to balanced/unbalanced converter 31. Intermediate frequency signals 62, 66 thus have the same phase. The phase difference between image interfering signal 64 and image interfering signal 67 is 180° in the output of IRM 25, so that the image interfering signals cancel each other out. Therefore, logically, the image interfering signals can be completely removed. In other words, IRM 25 can not only convert frequency as a double balanced mixer but also cancel an image. Signals having the image suppressed discussed above are supplied to balanced/unbalanced converter 31.

However, realistically, it is difficult to keep the accuracy with which two phase shifters change the phase of the image interfering signal by just 180°. That is because the phase change disperses for frequencies of the phase shifters, or the phase change disperses every phase shifter, for example. In this case, a difference between the phases of the image interfering signals is not just 180°, so that the image interfering signals cannot be completely cancelled out by each other and cannot be entirely removed.

Additionally, distortion or the like of DBM 26 or DBM 27 causes a harmonic signal, and the harmonic signal generates an image interfering signal. IRM 25 of embodiment 1 can suppress the image interfering signal by about 30 dB.

The high frequency receiver of the present invention moderates a damping amount of the filter by a suppressed amount of the image interfering signal by IRM 25, at the frequency of the image for generating the image interfering signal or the frequency for generating an image by combining a plurality of signals.

Figure 4:
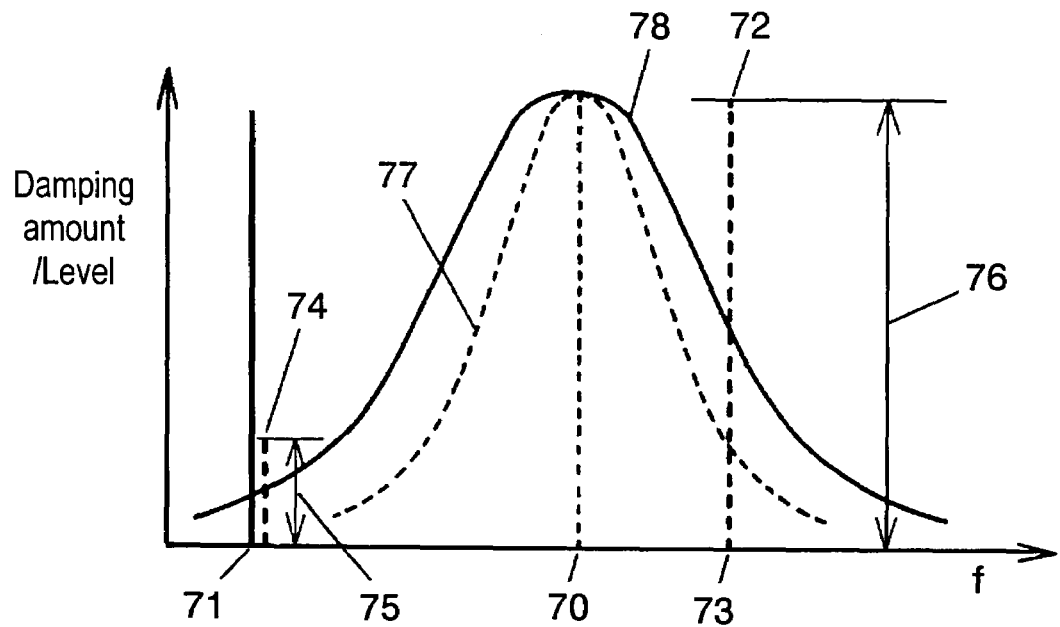
FIG. 4 is a damping characteristic diagram of a filter in accordance with exemplary embodiment 1.
Figure 5:
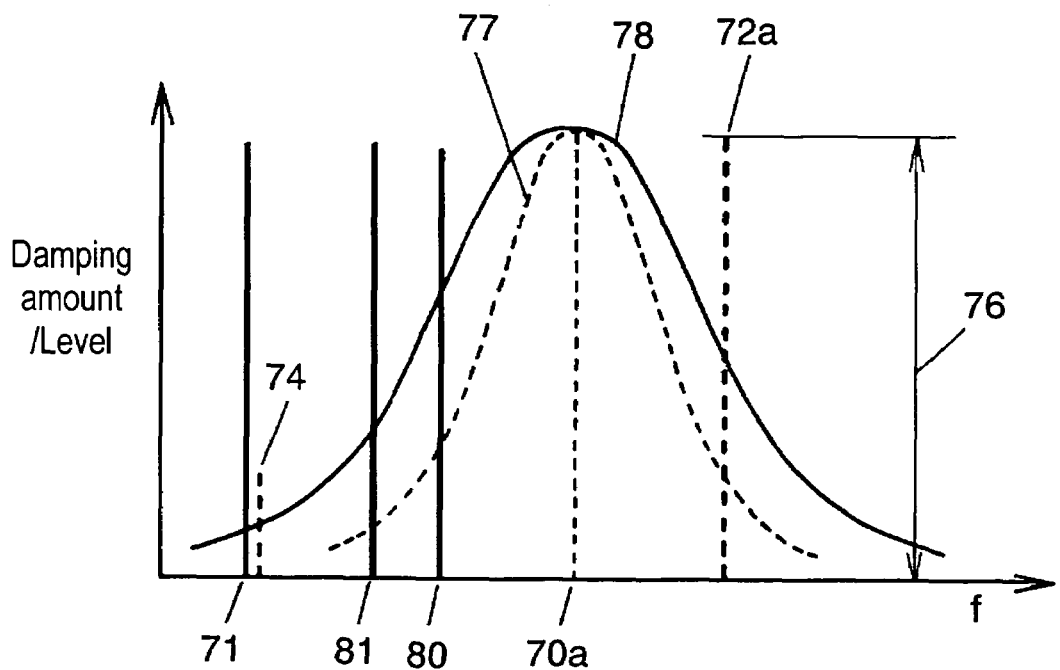
FIG. 5 is another damping characteristic diagram of the filter in accordance with exemplary embodiment 1.

Next, a relation between IRM 25 and a damping characteristic of the filter is described. FIG. 4 and FIG. 5 show damping characteristic diagrams of the filter in accordance with exemplary embodiment 1. The horizontal axis shows frequency, and the vertical axis shows signal level of the filter or damping amount.

In FIG. 4, a case where the desired channel is set at the VHF2 channel, for example, is described. Frequency 70 of the VHF2 channel in North America is about 55.25 MHz. Intermediate frequency 71 in North America is 45.25 MHz, so that frequency 73 of image 72 suppressed by IRM 25 is 146.75 MHz.

For providing image interfering signal 74 with a level 75 at which signal 74 does not affect a picture or the like, level 76 of image 72 must be suppressed by about 60 dB. IRM 25 can suppress the level of image 72 by about 30 dB, so that image interference does not occur even when the damping amount of image 72 by the filter at frequency 73 (146.75 MHz) is reduced to about 30 dB.

For suppressing the image interfering signal, a sharp damping characteristic such as damping characteristic 77 is required when the employed mixer is a normal DBM. When the employed mixer is an IRM, however, a filter can be used which has a moderated damping amount of about 30 dB at frequency 73 and has a gentle damping characteristic such as damping characteristic 78.

FIG. 5 shows suppression of the image generated by a plurality of high frequency signals in embodiment 1. In FIG. 5, an ultra high frequency (UHF) channel is assumed, and elements similar to those in FIG. 4 are denoted with the same reference numbers and the descriptions of those elements are omitted.

Frequency 70a of the UHF channel in North America is about 505.25 MHz.

Image 72a is generated from the sum of two frequencies 80 (295.25 MHz) and 81 (301.25 MHz) lower than frequency 70a of the desired channel. The IRM inverts the phase of image 72a itself to cancel out image 72a itself. An image generated by a plurality of high frequency signals can also be suppressed, so that the damping characteristics of the filter at frequencies 80, 81 can be moderated.

Thanks to the configuration discussed above, a filter having a large damping amount, a sharp damping characteristic, and high performance is not required. Even a filter having a gentle damping characteristic can prevent the image interference. In other words, when the IRM is employed in the high frequency receiver having a wide receiving band, the damping amount can be reduced at a specific frequency for generating the image interfering signal. Therefore, an inexpensive filter can be employed, and an inexpensive high frequency receiver can be provided.

Since the mixer of embodiment 1 is IRM 25, the damping amount of image 51 at frequency 52 can be kept to be about 30 dB and image 51 can be suppressed by 60 dB when input filter 21 is a single tuning circuit. Even only one tuning circuit can prevent the image interference, so that the filter can be inexpensive and an inexpensive high frequency receiver can be realized.

Second filter 23 is a fixed filter in embodiment 1, so that only one tuning circuit is employed and the tuned frequency need not be adjusted. Therefore, a high frequency receiver having high productivity can be provided.

Since only input filter 21 has the tuning circuit, Q value of the tuning circuit less changes with respect to the frequency and shift of the matching of the impedance is reduced. Variation of gain and waveform every channel is therefore reduced, so that stable receiving can be realized. This is important especially when a digital broadcast is received, and this configuration allows realization of an inexpensive digital receiving tuner.

Additionally, the high frequency receiver of embodiment 1 employs a low-pass filter having cutoff frequency of about 349 MHz as second filter 23. When the receiver receives low frequency signals capable of passing through the low-pass filter, the image occurrence due to a signal having high frequency of 349 MHz or higher can be suppressed.

According to an operation analysis, the IRM cannot remove an image interfering signal that is generated by an interference occurring at a frequency higher by the intermediate frequency than triple harmonic wave of oscillation frequency 45 of frequency-variable local oscillator 30. This interference is hereinafter called a third harmonic image. In embodiment 1, second filter 23 is the low-pass filter, and the image generated by the third harmonic of oscillator 30 when the channel having lowest frequency is received is made to have the cutoff frequency. The third harmonic image is therefore prevented from causing interference.

Figure 6:
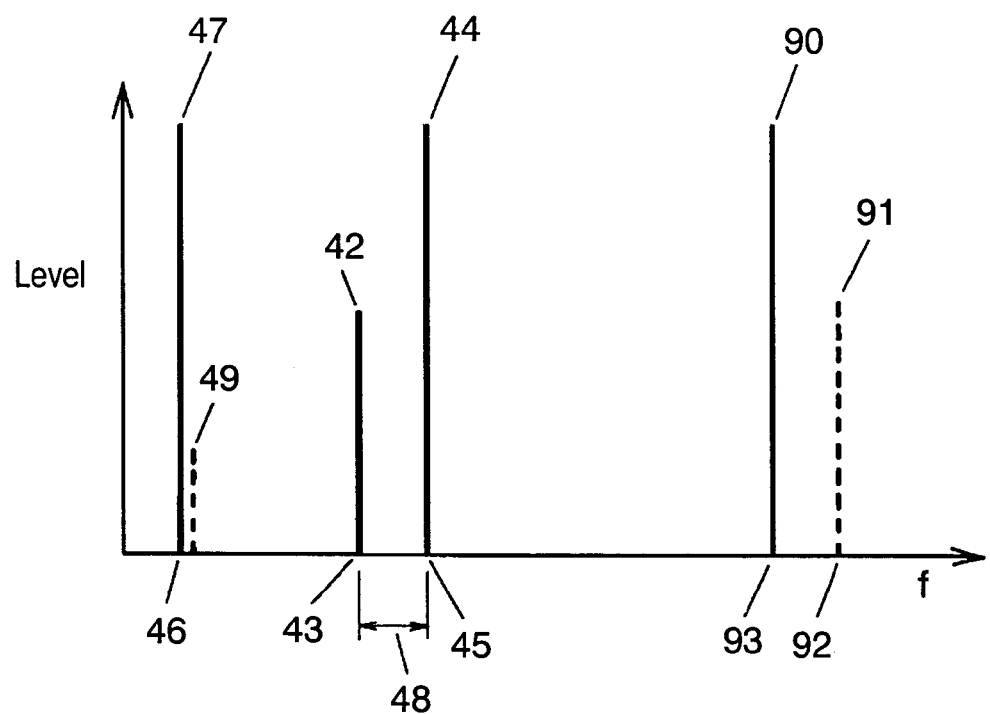
FIG. 6 illustrates an image by triple harmonic wave in accordance with exemplary embodiment 1.

This preventing operation is described specifically with reference to the drawing. FIG. 6 shows an image caused by the triple harmonic wave. An example of receiving the VHF2 channel, namely the channel having the lowest frequency, is described with reference to FIG. 6. When the VHF2 channel is received, oscillation frequency 45 of frequency-variable local oscillator 30 is 101 MHz. Frequency 92 of third harmonic image 91 corresponding to third harmonic 90 of oscillator 30 is about 349 MHz, namely higher than frequency 93 of third harmonic 90 by intermediate frequency 46. The interference is caused by third harmonic image 91 in IRM 25, so that interference by the third harmonic image is prevented by previously removing third harmonic image 91 itself with filter 21 or 23 on the upstream side of IRM 25.

Spuriouses by broadcast signals having a frequency of 349 MHz or higher can be suppressed, so that mutual interference by the spuriouses can be simultaneously prevented.

Second filter 23 damps the signal of third harmonic image 91 in embodiment 1; however, a filter for damping third harmonic image 91 may be disposed before input filter 21 and input terminal 20. In the latter case, third harmonic image 91 or undesired signal is prevented from being fed into high frequency amplifier 22, so that distortion of amplifier 22 can be reduced.

When a lower frequency such as the frequency in the VHF channel of the electronic tuner is received, for example, the cutoff frequency of the low-pass filter is set at about 360 MHz near a high end of the substantially VHF channel. Thus, image occurrence caused by the spurious or the like by a plurality of broadcast signals in the UHF band can be suppressed, and hence the image interference can be prevented. Here, the UHF band is not lower than the cutoff frequency.

A low-pass filter is used as the fixed filter in embodiment 1; however, a band-pass filter may be used. In the latter case, in receiving frequency capable of passing through the band-pass filter, the following image interferences can be prevented:

an image interference caused by a signal having a high frequency not lower than the cutoff frequency on the upside of the band-pass filter; and an image interference caused by a signal having a low frequency not higher than the cutoff frequency on the downside of the band-pass filter.

A high-pass filter may be used as the fixed filter. In this case, when a higher frequency such as the frequency in the UHF channel of the electronic tuner is received, for example, the cutoff frequency of the high-pass filter is set to be in the UHF band. Thus, image occurrence caused by the spurious or the like by a plurality of broadcast signals in the VHF band can be suppressed, and hence the image interference can be prevented. Here, the VHF band is not higher than the cutoff frequency.

A plurality of filters having a different pass band may be disposed and switched in response to a desired channel. A filter for reducing image occurrence can be thus selected in response to the desired channel. Therefore, a signal for generating an image interfering signal can be therefore suppressed over wider frequency.

IRM 25 is formed of a balanced circuit in embodiment 1, so that immunity against interruption or the like of an interfering signal can be improved, a stable mixer can be realized, and respective circuits can be disposed adjacently. A small high frequency receiver can be therefore obtained.

The damping amount of image 51 at frequency 52 is required simply to be secured at about 30 dB, so that input filter 21 may be formed of a double tuning circuit, for example, and high frequency amplifier 22 may be directly connected to unbalanced/balanced converter 24. Otherwise, unbalanced/balanced converter 24 may be interposed between high frequency amplifier 22 and input filter 21, high frequency amplifier 22 may be formed of a balanced circuit, and high frequency amplifier 22 may be directly connected to IRM 25. Signal loss can be reduced between high frequency amplifier 22 and IRM 25 in both configurations, so that degradation of the NF between them can be prevented. Therefore, even when a transistor having low NF is used in high frequency amplifier 22, the NF of the entire system can be maintained.

Since the transistor having low NF is used in high frequency amplifier 22, an inexpensive transistor such as a bipolar transistor can be used and an inexpensive high frequency receiver can be realized. IRM 25, frequency-variable local oscillator 30, and PLL 34 are integrated circuits using a bipolar transistor, so that high frequency amplifier 22, IRM 25, frequency-variable local oscillator 30, and PLL 34 can be stored in one integrated circuit, and a small high frequency receiver can be realized.

Second filter 23 is a fixed filter, but it may be a single tuning filter or a double tuning filter. Second filter 23 can therefore, further improve the damping characteristic at the frequency for generating an image interfering signal. Occurrence of image interference can be further prevented.

Input filter 21 is a single tuning filter in embodiment 1; however, input filter 21 may be a fixed filter especially in a small television capable of permitting an interference characteristic. In the latter case, filter loss is reduced, so that NF is improved and the filter is effective for the electronic tuner for a small television of which receiving sensitivity characteristic is important.

Phase shifter 28 of embodiment 1 is formed of a polyphase type filer including a capacitor and a resistor, so that phase shifter 28 does not require electric power. The high frequency receiver therefore requires less electric power, so that the receiver is extremely useful for portable equipment such as a cellular phone.

In the high frequency receiver of embodiment 1, a step-to-step filter is a fixed filter and interposed between the high frequency amplifier and the image rejection mixer. This configuration allows prevention of the image interference even when there are less tuning circuits. A tuning circuit is disposed only in the input filter, so that the Q value of the tuning circuit less changes with respect to the frequency and the shift of the matching of the impedance is reduced. Variation of gain and waveform of every channel is therefore reduced, so that stable receiving can be realized. This is important especially when a digital broadcast is received, and this configuration allows realization of an inexpensive digital receiving tuner.

EXEMPLARY EMBODIMENT 2

Figure 7:
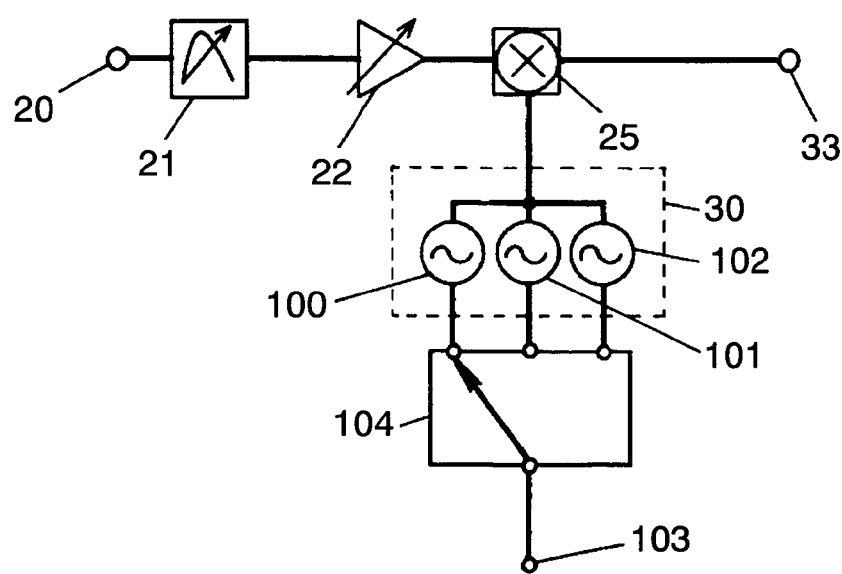
FIG. 7 is a block diagram of a high frequency receiver in accordance with exemplary embodiment 2 of the present invention.

Exemplary embodiment 2 of the present invention will be hereinafter described with reference to the drawings. FIG. 7 is a block diagram of a high frequency receiver in accordance with exemplary embodiment 2. In FIG. 7, elements similar to those in FIG. 1 are denoted with the same reference numbers and the descriptions of those elements are omitted.

In FIG. 7, frequency-variable local oscillator 30 is formed of three oscillators. Frequency-variable local oscillator 30 is generally formed of a circuit including a variable capacitance diode and an inductor element. One oscillator cannot completely cover the entire oscillation frequency region of frequency-variable local oscillator 30, so that a plurality of oscillators are generally employed. In embodiment 2, the entire oscillation frequency region is divided into three frequency bands, and oscillators 100, 101, and 102 cover respective frequency bands. Switch 104 is interposed between power supply terminal 103 and oscillators 100, 101, and 102, and selectively connects power supply terminal 103 to one of oscillators 100, 101, and 102. An input filter of embodiment 2 is formed of a single tuning circuit.

Figure 8A:
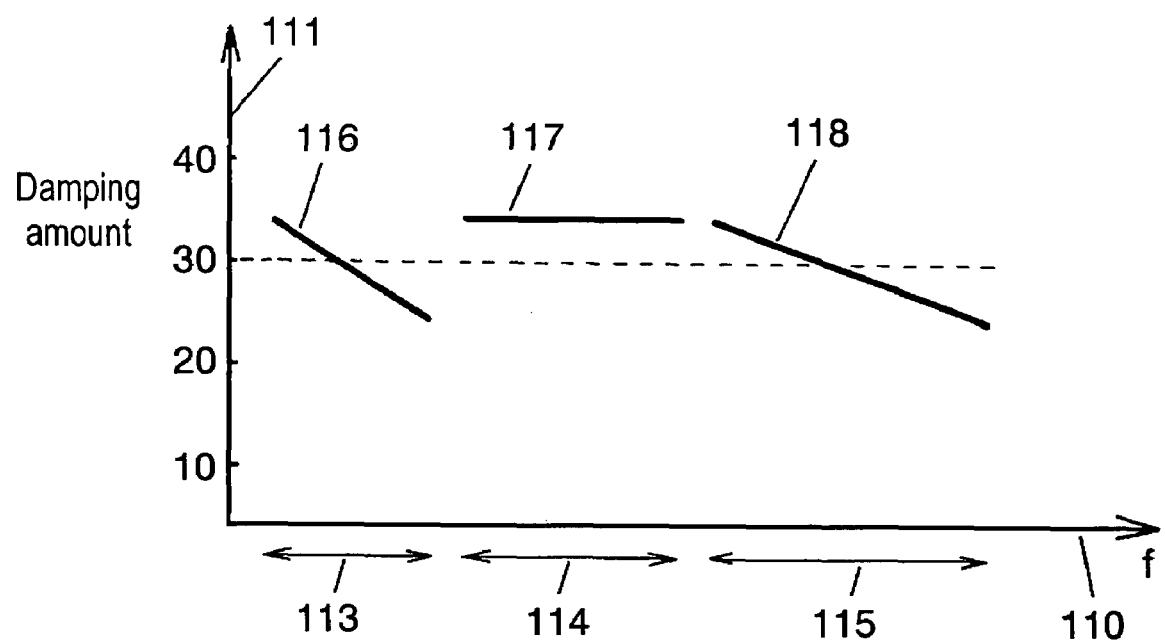
FIG. 8A and FIG. 8B are characteristic diagrams of a filter and a phase shifter in accordance with exemplary embodiment 2.
Figure 8B:
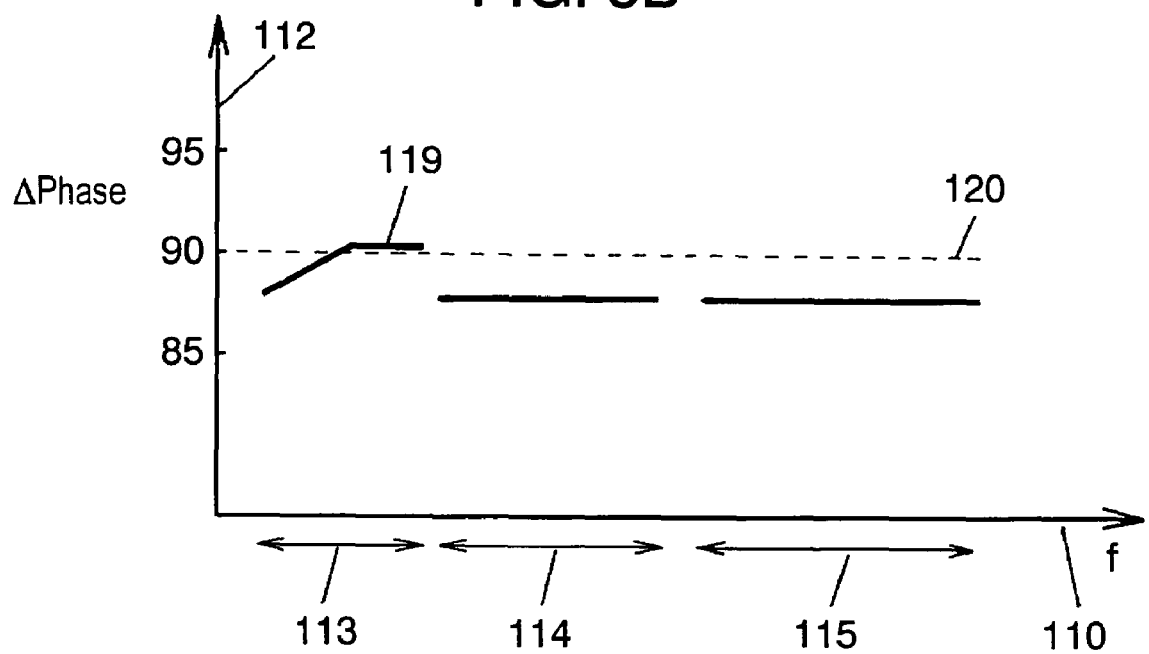

FIG. 8A shows an image damping amount by the filter with respect to received frequency in embodiment 2, and FIG. 8B shows a relation between the received frequency and a phase shift amount by phase shifters 28, 29.

In FIG. 8A and FIG. 8B, horizontal axis 110 shows the received frequency. Vertical axis 111 of FIG. 8A shows the sum of image damping amounts by input filter 21 and second filter 23. Vertical axis 112 of FIG. 8B shows a phase shift amount by the phase shifters.

In FIG. 8A and FIG. 8B, first frequency band 113 is a VHF low band and the frequency in this band ranges from 55.25 MHz to 127.25 MHz. Second frequency band 114 is a VHF high band, and the frequency in this band ranges from 133.25 MHz to 343.25 MHz. Third frequency band 115 is a UHF band, and the frequency in this band ranges from 349.25 MHz to 801.25 MHz.

According to the relation between the damping amount by the filter and the frequency, the damping amount depends on the frequency. The tuning circuit constituting input filter 21 employs a parallel resonant circuit, so that load Q is apt to decrease to degrade a damping characteristic at a higher frequency in the band. The higher frequency of the UHF band has no problem because the image frequency is higher than the receiving band. However, in the VHF band, especially in the VHF low band hardly forming an image trap, the degradation of the damping characteristic at the higher frequency raises a problem.

According to the relation between the received frequency and a phase shift amount by phase shifters 28, 29, phase shift curve 119 of phase shifter 29 shows that the phase shift amount of phase shifter 29 is apt to change every band. Phase shift curve 120 of phase shifter 28 shows that phase shifter 28 keeps the phase substantially constant independently of the frequency of a received channel. Phase shifter 28 is simply required to change the phase only of the intermediate frequency regardless of the desired channel, so that a poly-phase type phase shifter or the like may be used and a phase shifter having high phase shift accuracy can be provided.

In embodiment 2, phase shift 119 of phase shifter 29 with respect to first frequency band 113 where the damping amount by the filter is minimum is set closest to 90°, and the image suppressing amount in IRM 25 is increased.

A channel having a small damping amount by filter 21 is matched with a channel having a large image damping amount in IRM 25, thereby compensating a shortfall of the damping amount by the filter and suppressing an image in a wide receiving frequency band.

EXEMPLARY EMBODIMENT 3

Exemplary embodiment 3 of the present invention will be hereinafter described with reference to the drawings. FIG. 9 is a block diagram of a high frequency receiver in accordance with exemplary embodiment 3. In FIG. 9, elements similar to those in FIG. 1 are denoted with the same reference numbers and the descriptions of those elements are omitted.

In FIG. 9, switch 130 has common terminal 130a connected to the output part of high frequency amplifier 22, and three output terminals 130b, 130c, and 130d. Switch 130 selectively switches among output terminals 130b, 130c, and 130d. First output terminal 130b is directly connected to IRM 25. First low-pass filter 131 is interposed between second output terminal 130c and IRM 25. Second low-pass filter 132 is interposed between the output part of third output terminal 130d and IRM 25.

Channel-select-data generator 135 has one output part connected to PLL 34, and generates channel select data based on desired channel information inputted to input terminal 135a of channel select data generator 135. PLL 34 determines frequency of frequency-variable local oscillator 30 based on the channel select data. Controller 136 is interposed between the other output part of channel select data generator 135 and switch 130, and switches to an appropriate output terminal in response to channel select data generator 135.

As shown in FIG. 10, cutoff frequency 137 of low-pass filter 131 is 133.25 MHz, and cutoff frequency 138 of low-pass filter 132 is 349.25 MHz, for example. For receiving a VHF low band in this case, controller 136 selects output terminal 130b. For receiving a VHF high band, controller 136 selects output terminal 130c. For receiving a UHF band in this case, controller 136 selects output terminal 130d. An undesired signal can be thus prevented from being fed into IRM 25, so that image interference can be suppressed. In the UHF band, image frequency itself often lies out of a receiving band, so that only the damping characteristic of input filter 21 is required and signals are fed into IRM 25 directly without passing through the filter.

The low-pass filter is employed in embodiment 3; however, a band-pass filter, a high-pass filter, or a combination of them may be employed in response to a received frequency band or existence of a signal for generating an image.

EXEMPLARY EMBODIMENT 4

Exemplary embodiment 4 of the present invention will be hereinafter described with reference to the drawings. FIG. 11 is a block diagram of a high frequency receiver in accordance with exemplary embodiment 4. In FIG. 11, elements similar to those in FIG. 1 are denoted with the same reference numbers and the descriptions of those elements are omitted.

In embodiment 4, two high frequency receivers according to embodiment 1 are connected in parallel, high-pass filter 140 is interposed between input terminal 20 and input filter 21a of one high frequency amplifier 22a, and low-pass filter 141 is interposed between input terminal 20 and input filter 21b of the other high frequency amplifier 22b. Cutoff frequencies of high-pass filter 140 and low-pass filter 141 are about 350 MHz, namely frequency of a low-end channel of a substantially UHF band in embodiment 4.

The VHF channel is received by receiving unit 142 on the side having low-pass filter 141, and the UHF channel is received by receiving unit 143 on the side having high-pass filter 140. The separate receiving units therefore receive the VHF and UHF. In receiving the UHF, a frequency that is IF frequency lower or higher than higher harmonic wave lies out of the receiving band. Here, the higher harmonic wave has a frequency more than three times the oscillation frequency of local oscillator 30. No filter is therefore required between high frequency amplifier 22a and IRM 25a. Therefore, loss can be decreased between high frequency amplifier 22a and IRM 25a, so that the NF of the entire system can be improved.

The lowest frequency of triple harmonic wave image occurring in the VHF channel is provided when the channel having the lowest frequency is received. Therefore, when second filter 24b is interposed so that a frequency not lower than the lowest frequency of the triple harmonic wave image is the cutoff frequency, the image interference characteristic can be improved.

EXEMPLARY EMBODIMENT 5

Exemplary embodiment 5 of the present invention will be hereinafter described with reference to the drawings. FIG. 12 is a block diagram of a digital tuner for receiving ground wave in accordance with exemplary embodiment 5. In FIG. 12, elements similar to those in FIG. 1 are denoted with the same reference numbers and the descriptions of those elements are omitted.

In FIG. 12, switch 150 is interposed between high frequency amplifier 22 and IRM 25. Switch 150 has common terminal 150a connected to the output part of high frequency amplifier 22, and has output terminals 150b, 150c. Output terminal 150b is connected to IRM 25. DBM 151 is interposed between output terminal 150c and output terminal 33.

Both output parts of IRM 25 and DBM 151 are connected to demodulator 152. Error corrector 153 is disposed between the output part of demodulator 152 and output terminal 33. Error corrector 153 is formed of Viterbi corrector 154 and reed solomon corrector 155 connected to one output part of Viterbi corrector 154. The other output part of Viterbi corrector 154 is connected to determining device 156, and controller 157 is disposed between the output part of determining device 156 and switch control terminal 150d of switch 150.

Determining device 156 determines a bit error rate of an output of Viterbi corrector 154. When determining device 156 determines that the bit error rate is a predetermined value or higher, determining device 156 outputs a signal for commanding the controller to connect switch 150 to the IRM 25 side.

When the image interference has degraded the bit error rate, the IRM can prevent the image interference and hence the bit error rate can be improved. When no image signal exists and the bit error rate is high, the DBM can be used and hence power consumption can be reduced.

When the bit error rate of an output of Viterbi corrector 154 is generally 0.0002 or lower, reed solomon corrector 155 corrects the output to change the bit error rate at output terminal 33 to zero. When the bit error rate becomes 0.0002 or higher, determining device 156 transmits, to controller 157, a signal indicating that the bit error rate exceeds 0.0002. On receiving the signal, controller 157 transmits a signal for commanding switch 150 to switch between mixers.

When the bit error rate does not increase even if the mixer is switched from DBM 151 to IRM 25, determining device 156 determines that the fact that the bit error rate exceeds 0.0002 is not caused by an image, and returns the mixer to the DBM.

EXEMPLARY EMBODIMENT 6

Exemplary embodiment 6 of the present invention will be hereinafter described with reference to the drawings. FIG. 13 is a block diagram of a digital tuner for receiving ground wave in accordance with exemplary embodiment 6. In FIG. 13, elements similar to those in FIG. 1 and FIG. 12 are denoted with the same reference numbers and the descriptions of those elements are omitted.

In FIG. 13, switch 160 is interposed between the output part of high frequency amplifier 22 and DBM 27. Controller 161 is interposed between ON/OFF control terminal 160a of switch 160 and determining device 156. Switch 162 is disposed so as to control power supply to phase shifter 29. Switch 162 is connected so that controller 161 can control ON or OFF.

Controller 161 outputs a signal for turning on switches 160, 162 when the bit error rate exceeds 0.0002. In other words, when switches 160, 162 are usually turned off, high frequency signals are supplied only to the DBM 26 side, phase shifter 29 and DBM 27 do not operate, and hence the power consumption can be reduced. When the bit error rate increases, controller 161 functions as the IRM by turning on switches 160, 162, thereby preventing an image.

Phase shifter 28 employs a poly-phase filter in embodiment 6; however, phase shifter 28 may be a phase shifter of a flip-flop type by multi-ply and division similarly to phase shifter 29.

EXEMPLARY EMBODIMENT 7

Exemplary embodiment 7 of the present invention will be hereinafter described with reference to the drawings. FIG. 14 is a circuit diagram of an input filter in accordance with exemplary embodiment 7 of the present invention.

In embodiment 7, a variable image trap is disposed in the input filter. In FIG. 14, the input filter is interposed between input terminal 160 and output terminal 163. Input terminal 160 is connected to a series connection body of first inductance 161 and second inductance 162. Output terminal 163 is connected to one of output parts of second inductance 162, and variable capacitance diode 164 is interposed between the other of the output parts and the ground. The anode side of variable capacitance diode 164 is grounded.

Input terminal 160 is connected to a series connection body of third inductance 165 and switch 166 in parallel with first inductance 161. Switch 166 is turned off in receiving a VHF low band, or turned on in receiving a VHF high band.

Fourth inductance 167 is interposed between the output part of third inductance 165 and the ground. For changing capacitance of variable capacitance diode 164, control voltage supplied to control terminal 168 connected to the cathode side of variable capacitance diode 164 is varied.

In tuning filter 169 having this configuration, second variable capacitance diode 170 is interposed between fourth inductance 167 and the ground, and control terminal 168 is connected to the cathode-side terminal of second variable capacitance diode 170 to form a variable trap.

Constants of respective circuits of embodiment 7 are as follows: first inductance 161 is 300 nH, second inductance 162 is 70 nH, third inductance 165 is 40 nH, and fourth inductance 167 is 40 nH. While, capacitances of variable capacitance diodes 164, 170 are changed from 60 pF to 3 pF by changing control voltage from 1V to 25V.

Figure 15A:
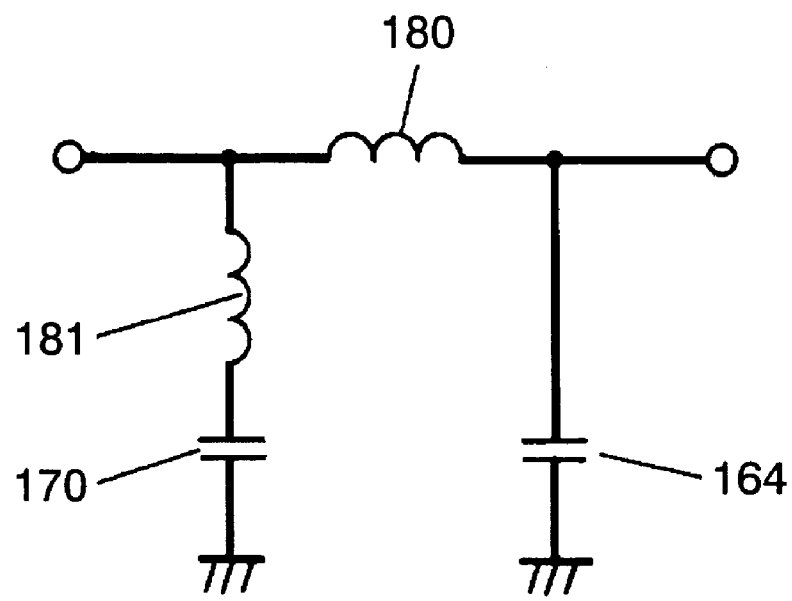
FIG. 15A and FIG. 15B are equivalent circuit diagrams in accordance with exemplary embodiment 7.
Figure 15B:
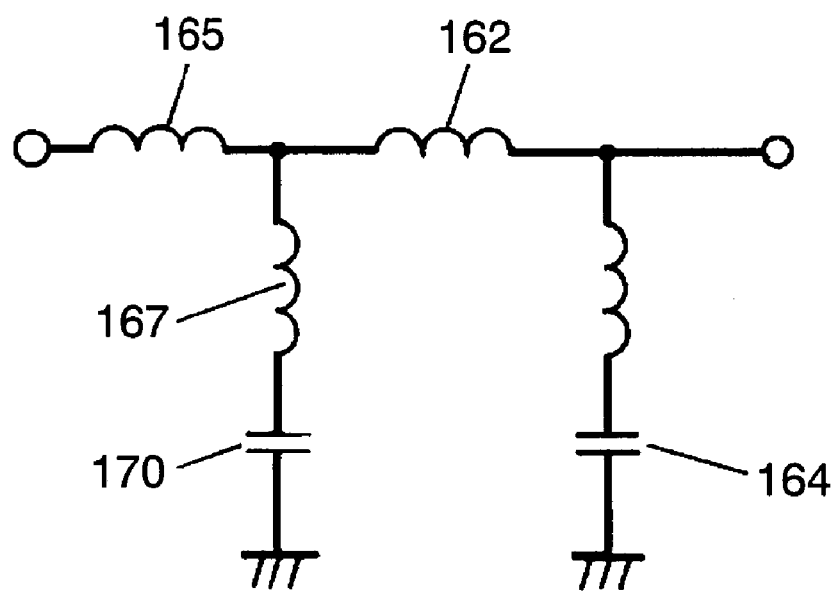
Figure 16A:
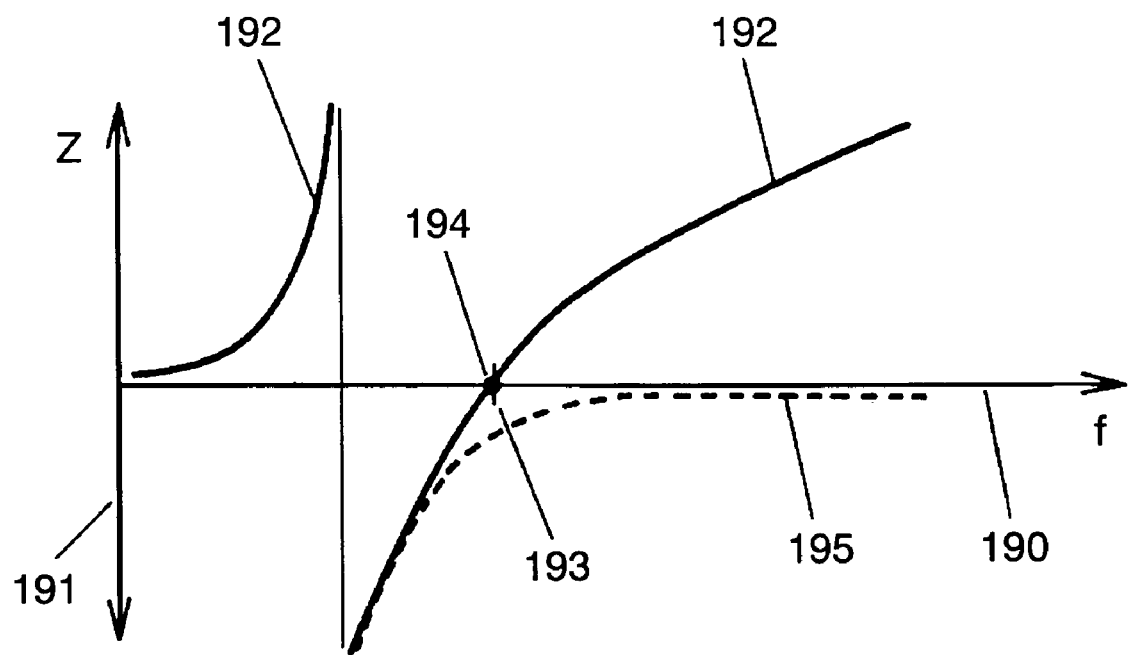
FIG. 16A and FIG. 16B are impedance characteristic diagrams in accordance with exemplary embodiment 7.
Figure 16B:
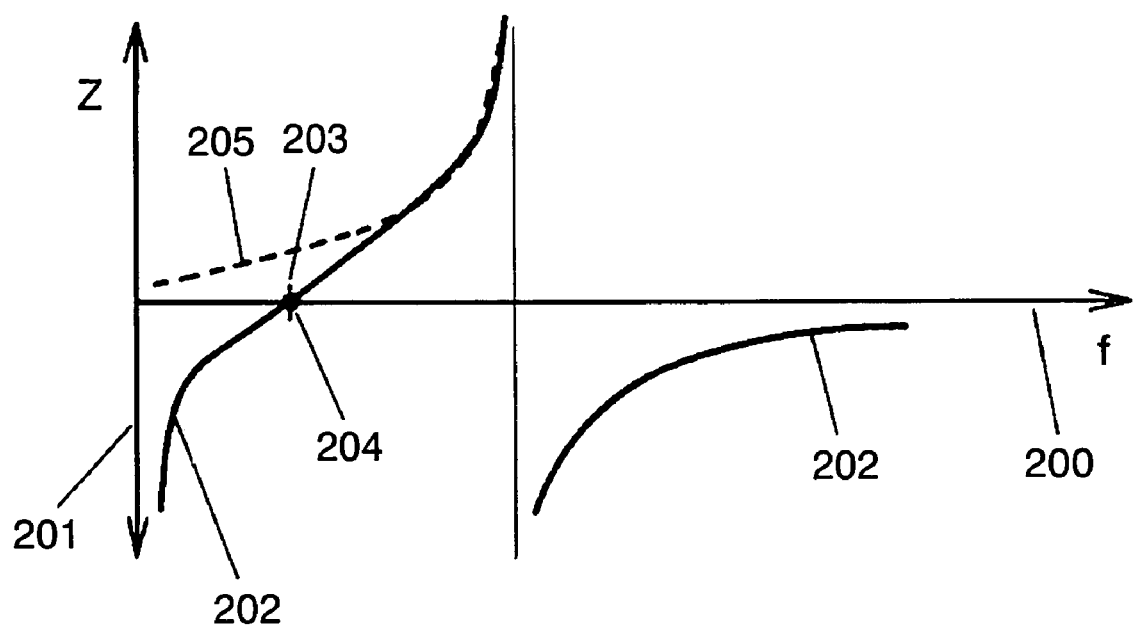
Figure 17A:
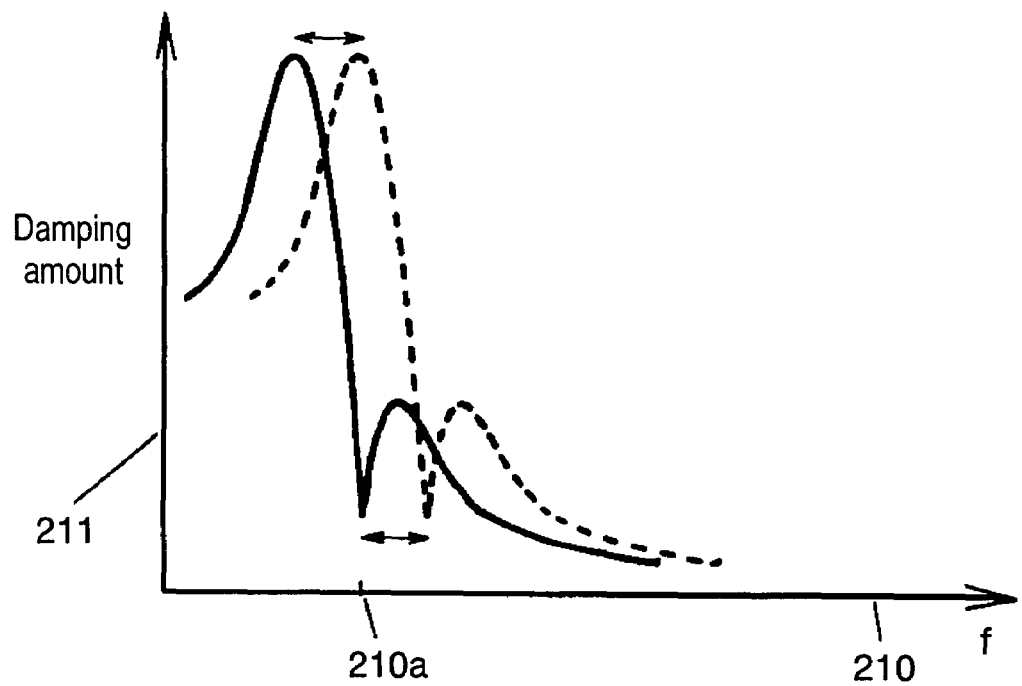
FIG. 17A and FIG. 17B are damping characteristic diagrams in accordance with exemplary embodiment 7.
Figure 17B:
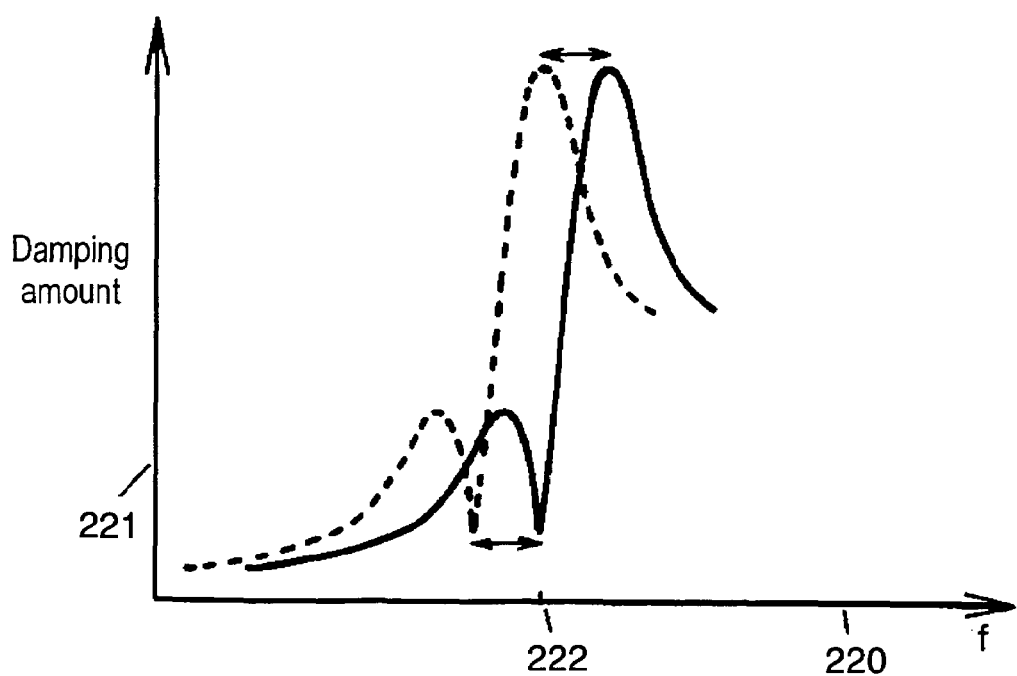

Operations of the input filter are described with reference to FIG. 15A, FIG. 15B, FIG. 16A, FIG. 16B, FIG. 17A, and FIG. 17B. FIG. 15A and FIG. 15B are equivalent circuit diagrams of the input filter in accordance with exemplary embodiment 7. FIG. 16A and FIG. 16B are impedance characteristic diagrams of the input filter. FIG. 17A and FIG. 17B are damping characteristic diagrams of the input filter.

An operation performed when the input filter of embodiment 7 receives a VHF low band is described. FIG. 15A shows an equivalent circuit used when the input filter of embodiment 7 receives the VHF low band. Switch 166 is turned off in this case, so that first inductance 161 and second inductance 162 form first equivalent inductance 180, and third inductance 165 and fourth inductance 167 form second equivalent inductance 181. First equivalent inductance 180 corresponds to 80 nH, and second equivalent inductance 181 corresponds to 370 nH.

The input filter is therefore formed of a parallel resonance circuit and a trap circuit of a series resonance circuit. The parallel resonance circuit has first equivalent inductance 180, second equivalent inductance 181, and the capacitance of first variable capacitance diode 164. The series resonance circuit has second equivalent inductance 181 and the capacitance of second variable capacitance diode 170.

FIG. 16A shows impedance provided when the input filter of embodiment 7 receives the VHF low band. Horizontal axis 190 shows frequency, and vertical axis 191 shows impedance. FIG. 17A shows a damping characteristic provided when the input filter receives the VHF low band. Horizontal axis 210 shows frequency, and vertical axis 211 shows damping amount.

In FIG. 16A, curve 192 shows variation of impedance with respect to the frequency of the input filter. The impedance of the input filter varies from C-component to L-component as the frequency exceeds a parallel resonance frequency for tuning in response to the capacitance of variable capacitance diode 170. Pole 194 occurs due to the series resonance at specific frequency 193 higher than the tuned frequency. The impedance is zero at pole 194, so that the damping characteristic of the input filter increases at frequency 193 as shown in FIG. 17A.

Constants of second equivalent inductance 181 and the capacitance of variable capacitance diode 170 are determined so that frequency 193 of pole 194 equals to the frequency of the image of a received channel in embodiment 7. Trap frequency 210a is changed in response to the received channel by changing the capacitance of variable capacitance diode 170, as shown in FIG. 17A.

Curve 195 shows impedance provided when no variable capacitance diode 170 exists and fourth inductance 167 is directly grounded in FIG. 16A. As shown in FIG. 16A, variation of the impedance is small near the parallel resonance frequency for tuning of the input filter regardless of the existence of variable capacitance diode 170. In other words, the variation of the impedance increases in response to the capacitance of variable capacitance diode 170 in the direction where the frequency is higher than the parallel resonance frequency for tuning. Therefore, the impedance near the resonance frequency does not largely vary even when the capacitance of variable capacitance diode 170 is varied.

An operation performed when the input filter of embodiment 7 receives a VHF high band is described. FIG. 15B shows an equivalent circuit used when the input filter of embodiment 7 receives the VHF high band. Switch 166 is turned on in this case. First inductance 161 is 300 nH and third inductance 165 is 40 nH, so that the impedance on the third inductance 165 side is dominant and first inductance 161 may be neglected in embodiment 7.

The input filter is therefore formed of a parallel resonance circuit and a trap circuit of a series resonance circuit. The parallel resonance circuit includes second inductance 162, fourth inductance 167, and the capacitance of first variable capacitance diode 164. The series resonance circuit has fourth inductance 167 and the capacitance of second variable capacitance diode 170.

FIG. 16B shows impedance provided when the input filter of embodiment 7 receives the VHF high band. Horizontal axis 200 shows frequency, and vertical axis 201 shows impedance. FIG. 17B shows a damping characteristic provided when the input filter receives the VHF high band. Horizontal axis 220 shows frequency, and vertical axis 221 shows damping amount.

In FIG. 16B, curve 202 shows variation of impedance with respect to the frequency of the input filter. The impedance of the input filter varies from L-component to C-component as the frequency becomes lower than a parallel resonance frequency for tuning in response to the capacitance of variable capacitance diode 170. Pole 204 occurs due to the series resonance at specific frequency 203 lower than the tuned frequency. The impedance is zero at pole 204, so that the damping characteristic of the input filter increases at frequency 203 as shown in FIG. 17B.

Frequency 203 of pole 204 works as a trap of the frequency band of the VHF low band, and trap frequency 222 is varied by changing the capacitance of variable capacitance diode 170 in embodiment 7, as shown in FIG. 17B.

Curve 205 shows impedance provided when no capacitance of variable capacitance diode 170 exists :and fourth inductance 167 is directly grounded in FIG. 16B. As shown in FIG. 16B, variation of the impedance is small near the resonance frequency of the input filter regardless of the existence of variable capacitance diode 170. In other words, the variation of the impedance increases in response to the capacitance of variable capacitance diode 170 in the direction where the frequency is lower than the parallel resonance frequency for tuning. Therefore, the impedance near the parallel resonance frequency for tuning does not largely vary even when the capacitance of variable capacitance diode 170 is varied.

EXEMPLARY EMBODIMENT 8

Figure 18:
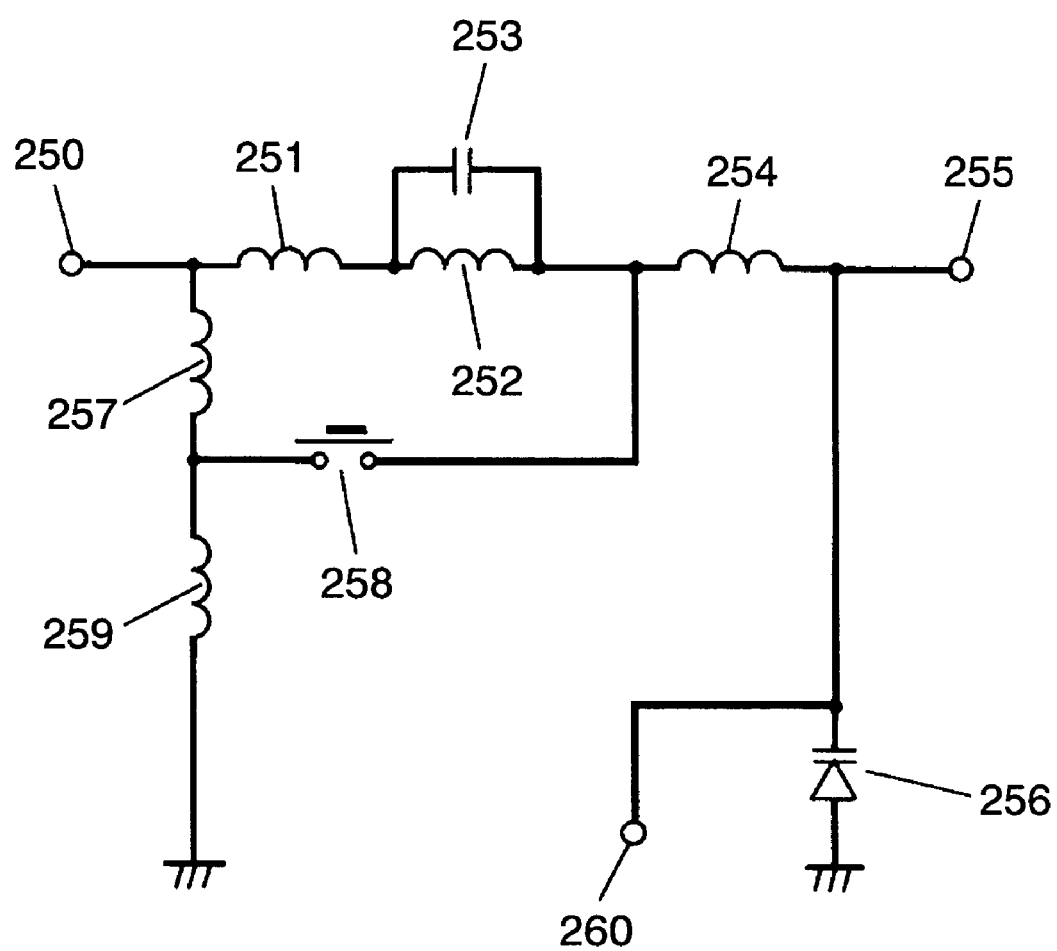
FIG. 18 is another circuit diagram of an input filter in accordance with exemplary embodiment 8 of the present invention.

Exemplary embodiment 8 of the present invention will be hereinafter described with reference to the drawings. FIG. 18 is a circuit diagram of an input filter in accordance with exemplary embodiment 8. A fixed image trap is disposed in the input filter.

In FIG. 18, the input filter is interposed between input terminal 250 and output terminal 255. Input terminal 250 is connected to first inductance 251, second inductance 252, and third inductance 254 in series.

One of output parts of third inductance 254 is connected to output terminal 255, and variable capacitance diode 256 is interposed between the other of the output parts of third inductance 254 and the ground. The anode side of variable capacitance diode 256 is grounded.

A series connection body of fourth inductance 257 and switch 258 is interposed between input terminal 250 and third inductance 254, and fifth inductance 259 is interposed between the output part of fourth inductance 257 and the ground. Switch 258 is turned off in receiving a VHF low band, or turned on in receiving a VHF high band.

Changing the capacitance of variable capacitance diode 256 varies the tuned frequency of the tuning circuit. In other words, control voltage supplied to control terminal 260 connected to the cathode side of variable capacitance diode 256 is varied in response to a received channel. Capacitor 253 is disposed in parallel with second inductance 252 to form a fixed trap.

Constants of respective circuits of embodiment 8 are as follows: first inductance 251 is 300 nH, second inductance 252 is 60 nH, third inductance 254 is 70 nH, fourth inductance 257 is 40 nH, and fifth inductance 259 is 40 nH. While, capacitance of variable capacitance diodes 256 is varied from 60 pF to 3 pF by changing control voltage from 1V to 25V.

Figure 19A:
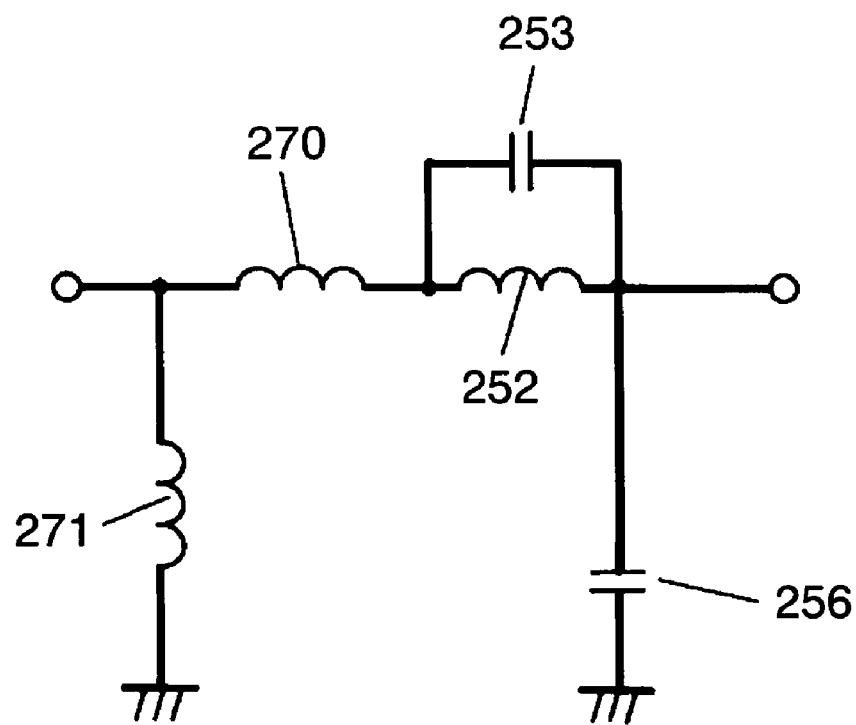
FIG. 19A and FIG. 19B are equivalent circuit diagrams in accordance with exemplary embodiment 8.
Figure 19B:
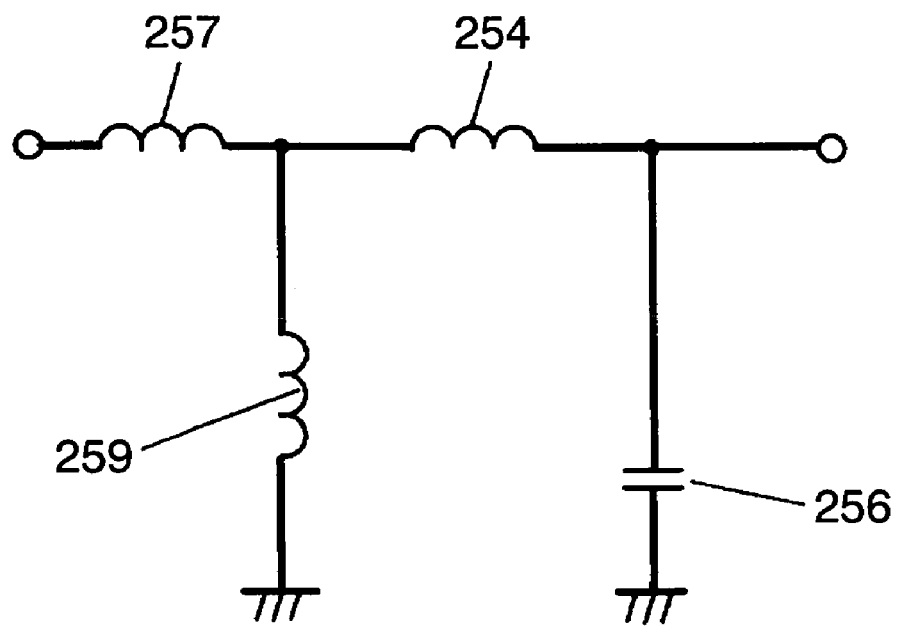
Figure 20A:
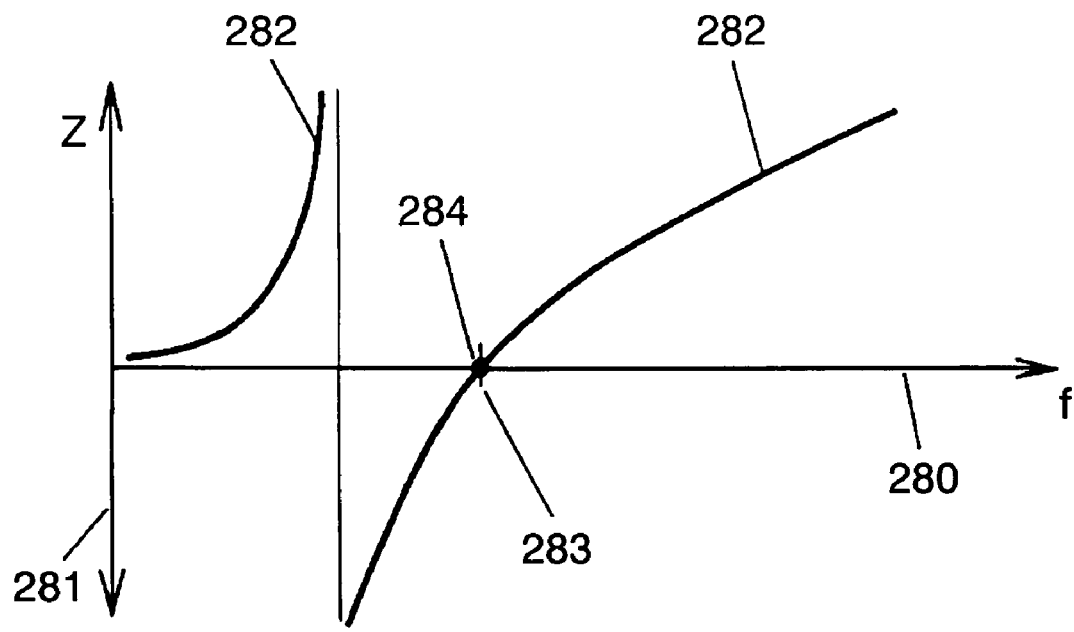
FIG. 20A and FIG. 20B are impedance characteristic diagrams in accordance with exemplary embodiment 8.
Figure 20B:
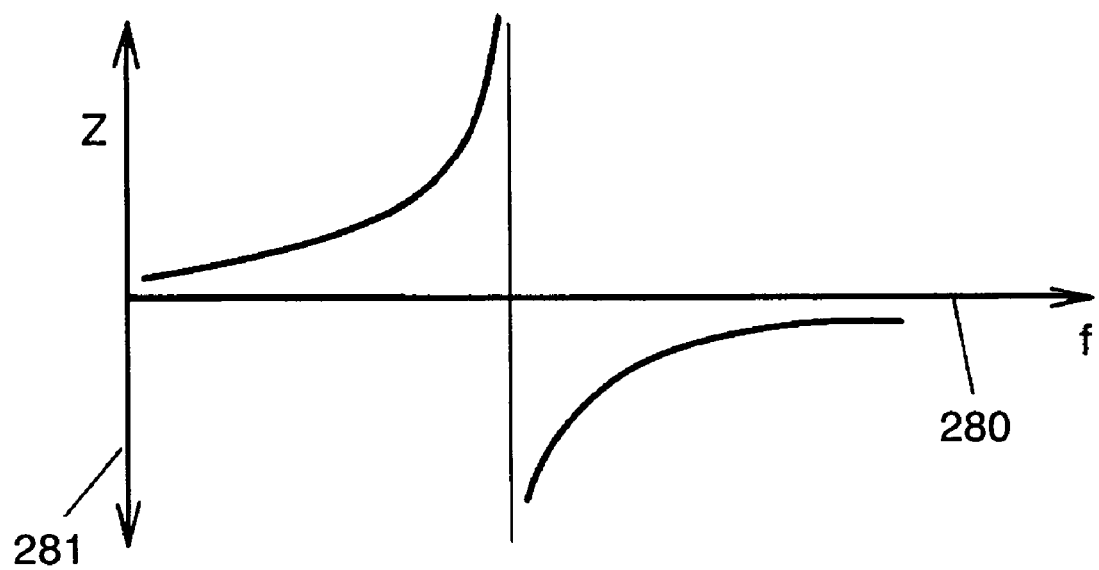
Figure 21A:
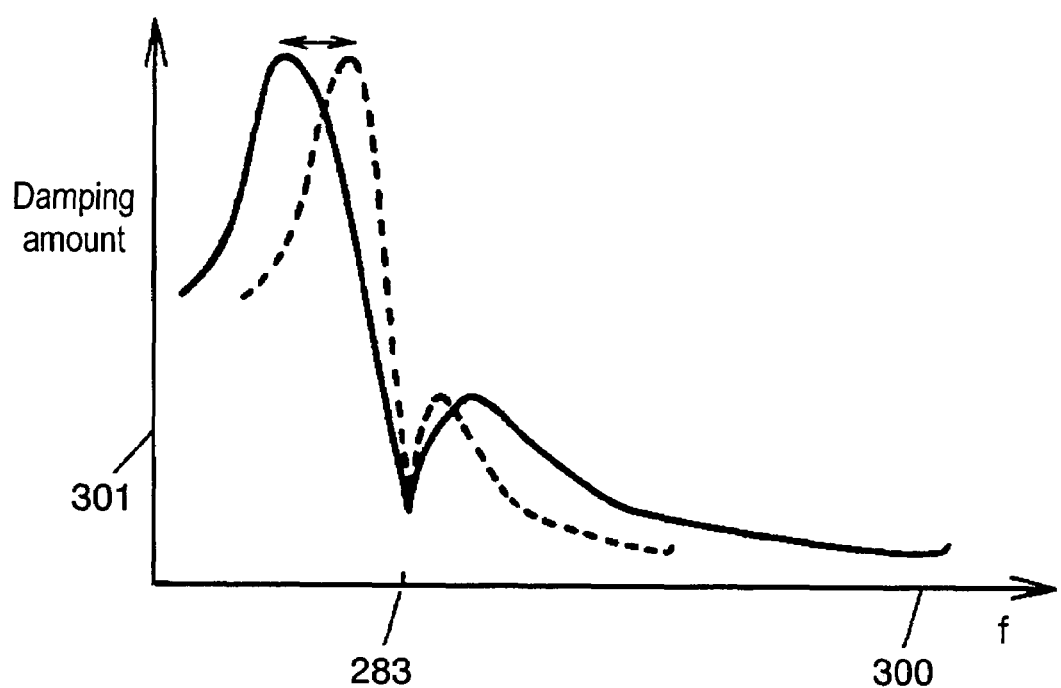
FIG. 21A and FIG. 21B are damping characteristic diagrams in accordance with exemplary embodiment 8.
Figure 21B:
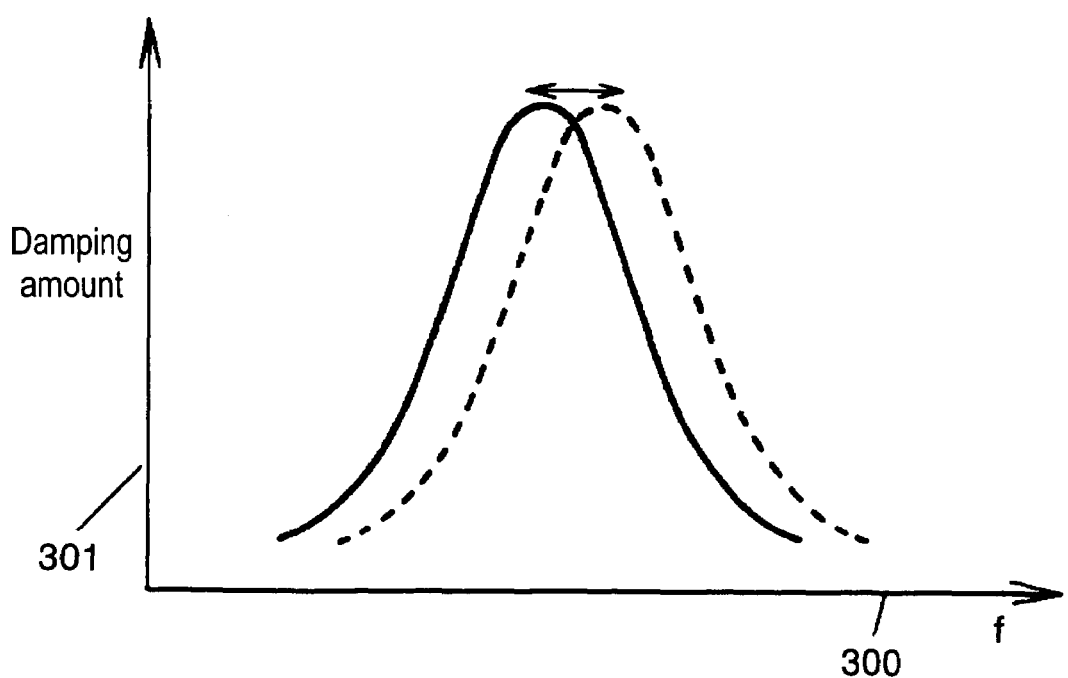

Operations of the input filter are described with reference to FIG. 19A, FIG. 19B, FIG. 20A, FIG. 20B, FIG. 21A, and FIG. 21B. FIG. 19A and FIG. 19B are equivalent circuit diagrams of the input filter in accordance with exemplary embodiment 8. FIG. 20A and FIG. 20B are impedance characteristic diagrams of the input filter. FIG. 21A and FIG. 21B are damping characteristic diagrams of the input filter.

An operation performed when the input filter of embodiment 8 receives a VHF low band is described. FIG. 19A shows an equivalent circuit used when the input filter of embodiment 8 receives the VHF low band. Switch 258 is turned off in this case, so that first inductance 251 and third inductance 254 form first equivalent inductance 270, and fourth inductance 257 and fifth inductance 259 form second equivalent inductance 271. First equivalent inductance 270 corresponds to 370 nH, and second equivalent inductance 271 corresponds to 80 nH.

The input filter is therefore formed of a parallel resonance circuit and a fixed trap circuit. The parallel resonance circuit has first equivalent inductance 270, second equivalent inductance 271, the capacitance of variable capacitance diode 256, and second inductance 252. The fixed trap circuit has second inductance 252 and capacitor 253.

FIG. 20A shows impedance provided when the input filter of embodiment 8 receives the VHF low band. Horizontal axis 280 shows frequency, and vertical axis 281 shows impedance. FIG. 21A shows a damping characteristic provided when the input filter receives the VHF low band. Horizontal axis 300 shows frequency, and vertical axis 301 shows damping amount.

In FIG. 20A, curve 282 shows variation of impedances with respect to the frequency of the input filter. The impedance of the input filter varies from C-component to L-component as the frequency exceeds a parallel resonance frequency for tuning in response to the capacitance of capacitor 253. Pole 284 occurs at specific frequency 283 higher than the tuned frequency. The impedance is zero at pole 284, so that the damping characteristic of the input filter increases at frequency 283 as shown in FIG. 21A.

Each constant is determined in embodiment 8 so that frequency 283 of pole 284 equals to the frequency of the image for a substantially central channel of the VHF low band.

However, the image frequency in receiving the VHF low band lies within the frequency band of the VHF high band. Trap frequency 283 of the fixed trap of embodiment 8 lies within the frequency band of the VHF high band. Therefore, when the trap operates also in receiving the VHF high band, a signal in the channel near trap frequency 283 is damped by the fixed trap and hence can be received.

Therefore, when the VHF high band is received in the input filter of embodiment 8, switch 258 is turned on to prevent an operation of the trap circuit having second inductance 252 and capacitor 253.

An operation performed when the input filter of embodiment 8 receives a VHF high band is described. FIG. 19B shows an equivalent circuit used when the input filter of embodiment 8 receives the VHF high band. In embodiment 8, first inductance 251 is 300 nH and fourth inductance 257 is 40 nH, so that the impedance on the fourth inductance 257 side is dominant. In this case, first inductance 251, second inductance 252, and capacitor 253 may be neglected.

The input filter has only a parallel resonance circuit having fifth inductance 259, fourth inductance 257, third inductance 254, and the capacitance of variable capacitance diode 256. In this case, a trap circuit does not work, so that no pole occurs in receiving the VHF high band as shown in FIG. 20B. As shown in FIG. 21B, therefore, there is no trap for damping a specific frequency and the fixed trap hardly produces an effect in receiving the VHF high band.

EXEMPLARY EMBODIMENT 9

Figure 22:
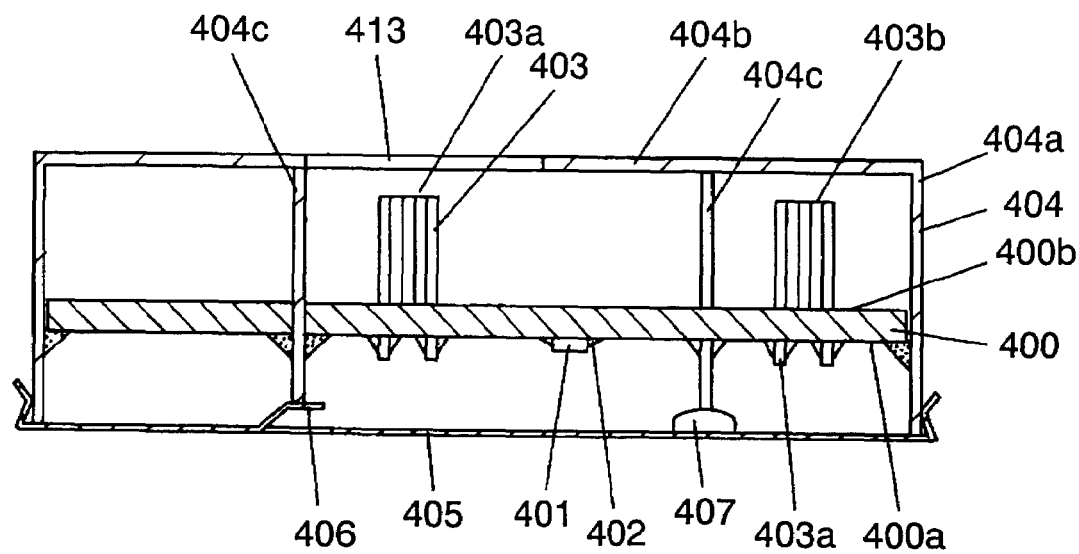
FIG. 22 is a sectional view of a high frequency receiver in accordance with exemplary embodiment 9 of the present invention.
Figure 23:
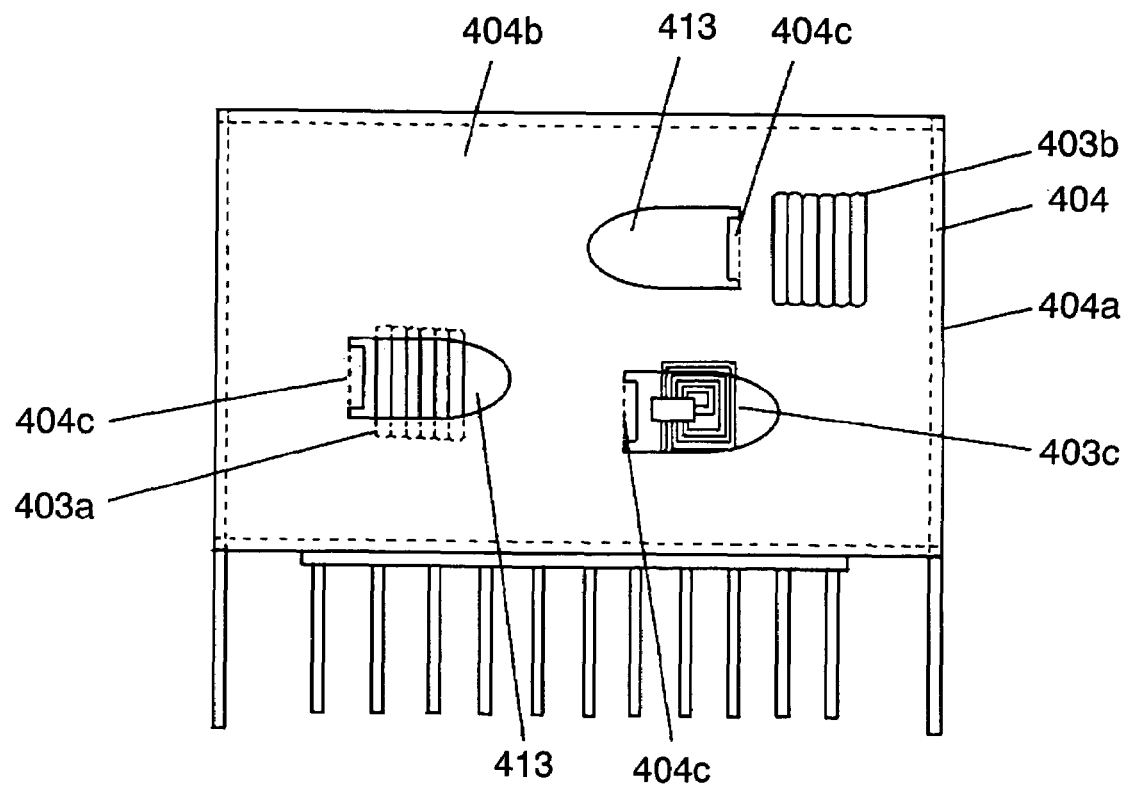
FIG. 23 is a top view of the high frequency receiver in accordance with exemplary embodiment 9.
Figure 25A:
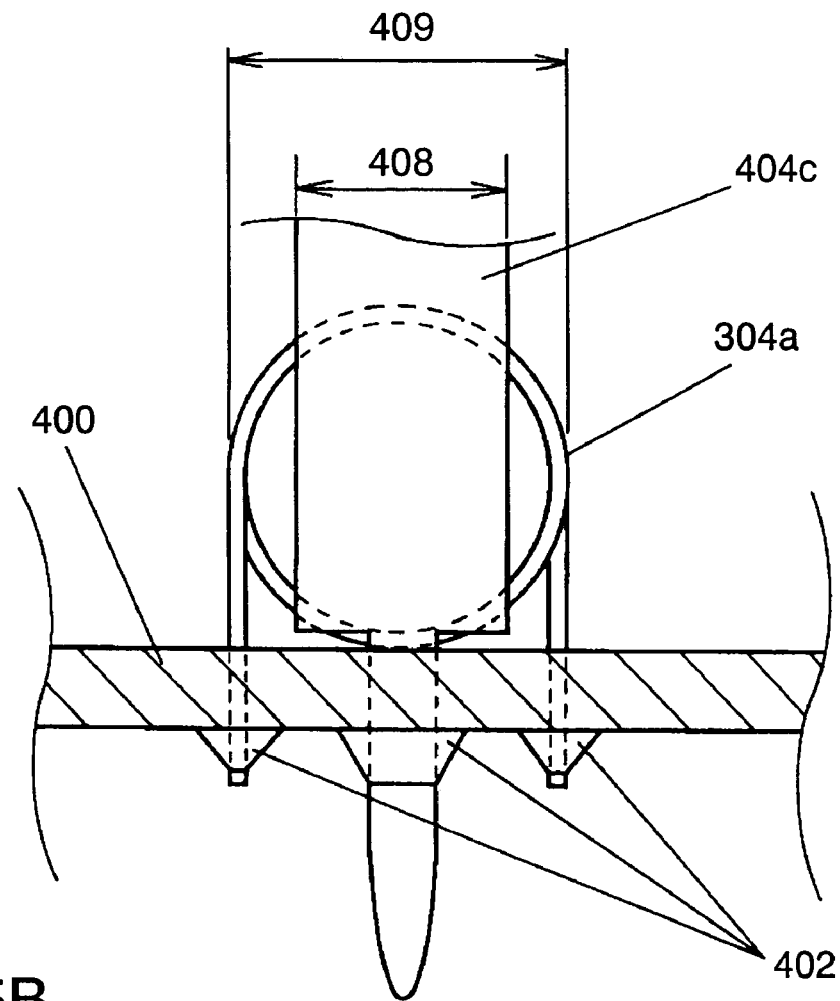
FIG. 25A and FIG. 25B are detail drawings of essential parts of the high frequency receiver in accordance with exemplary embodiment 9.
Figure 25B:
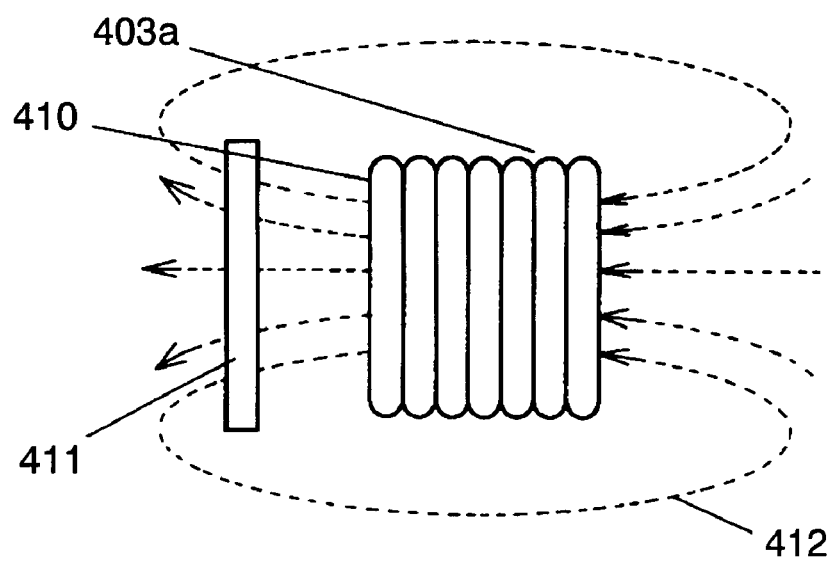
Figure 26:
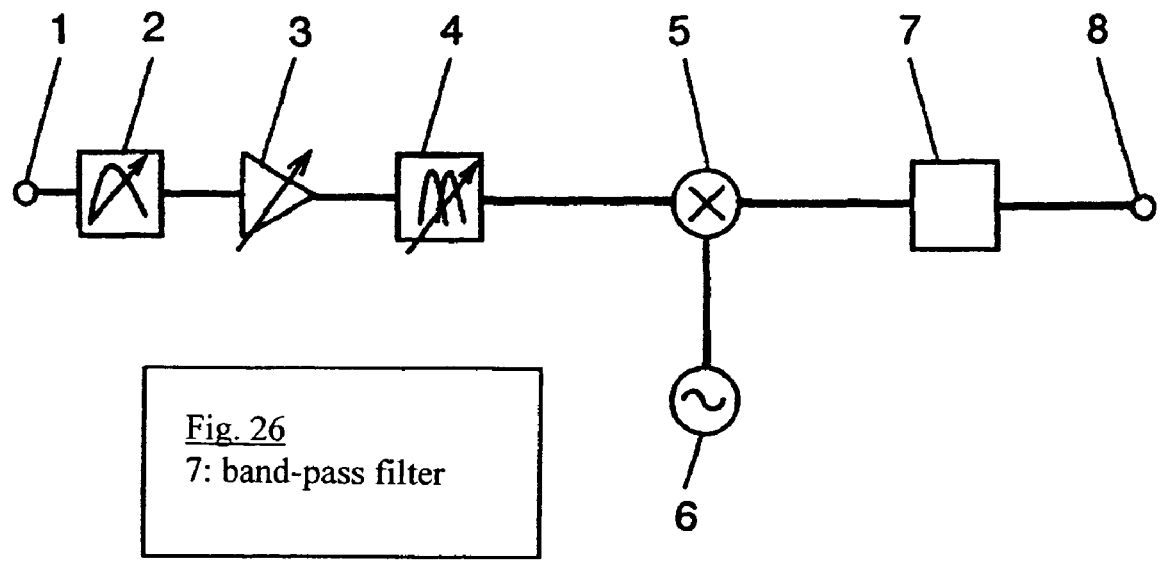
FIG. 26 is a block diagram of a conventional high frequency receiver.

Exemplary embodiment 9 of the present invention will be hereinafter described with reference to the drawings. In exemplary embodiment 9, a high frequency receiver of the present invention is stored in a shield case. FIG. 22 is a sectional view of the high frequency receiver in accordance with exemplary embodiment 9. FIG. 23 is a top view of the high frequency receiver. FIG. 24 is an expanded view of the shield case of the high frequency receiver of exemplary embodiment 9. FIG. 25A and FIG. 25B are detail drawings of essential parts of the high frequency receiver of exemplary embodiment 9.

In FIG. 22 to FIG. 25A and FIG. 25B, electronic component 401 is mounted on one surface 400a of printed board 400 and connected to printed board 400 with cream solder 402. Inductances 403 are mounted on the other surface 400b of printed board 400. Each inductance 403 is a coil, and legs 403a thereof are inserted into holes formed in printed board 400. Legs 403a are joined to printed board 400 with solder 402.

Shield case 404 is engaged with printed board 400 on which electronic component 401 and inductance 403 are previously mounted to form a high frequency circuit. The ground part of the high frequency circuit is soldered and connected to frame 404a of shield case 404 at the peripheral edge of printed board 400.

Shield case 404 has lid 404b for covering the side having inductance 403, and lid 404b is formed integrally with frame 400a of printed board 400. Lid 404b has legs 404c formed by cutting and bending a part of lid 404b. The tips of legs 404c penetrate printed board 400, and are joined to printed board 400 with solder 402 on the mounted side of electronic component 401.

Cover 405 for covering the opening of shield case 404 is mounted to the mounted side of electronic component 401. Cover 405 includes elastic contact claw 406 or abutting part 407. Elastic contact claw 406 or abutting part 407 is butted on the tip of each leg 404c to act as a shield.

In embodiment 9, width 408 of each leg 404c is substantially equal to width 409 of each inductance 403, and inductance 403 is disposed closely to leg 404c. Especially, a ground part of a circuit formed of coil 403a is connected to the leg disposed closely to coil 403a.

Leg 404c is especially and preferably disposed in the magnetic flux direction of inductance 403, as shown in FIG. 25B. When an air-core coil is used as inductance 403, for example, it is important that opening surface 410 of coil 403a faces wide surface 411 of leg 404c.

In this configuration, magnetic flux 412 generated by inductance 403 can be shielded by leg 404c, thereby preventing coupling with the other inductance.

The damping characteristic of the filter of the high-frequency receiver can be moderated using the IRM, discussed in embodiment 1. The number of tuning filters apt to couple to each other especially due to the magnetic flux can be therefore decreased. The high-frequency receiver of the present invention having the configuration of embodiment 9 requires only a small number of easy-to-couple coils 403a for the tuning filter, so that even a simple shield prevents the coupling with the other coil.

Frame 404a, lid 404b, and legs 404c are integrally formed in shield case 404 of embodiment 9, so that the ground can be kept stably for vibration or the like. An interval between coil 403a and the lid does not vary, so that the inductance value becomes stable to decrease waveform variation of the filter.

Frame 404a, lid 404b, and legs 404c can be simultaneously machined by press working or the like, so that an inexpensive shield case can be obtained and an inexpensive high-frequency receiver can be realized. The cover exists only on one side, so that assembling is facilitated and assembling man-hour can be reduced.

Coil 403a is disposed outside a bending part of leg 404c. In this case, coil 403a is disposed under hole 413 produced by cutting and bending the leg 404c. Hole 413 can be used also as a hole for adjustment. While, coil 403b is disposed inside a bending part of the other leg 404c. No hole exists over coil 403b, so that the magnetic flux of coil 403b can be further shielded to prevent coupling to the other coil, interruption of an undesired signal from the outside, and leakage of a signal.

The air-core coil is used as the inductance in embodiment 9; however, a chip inductor or a pattern coil may by used. In the latter case, the coupling to the other inductance can also be reduced.

Q value of the chip inductor or the pattern coil is generally smaller than that of the air-core coil, and is easily affected by a neighboring metal plate or the like. In embodiment 9, however, width 408 of leg 404c is substantially equal to width 409 of the inductance, so that leg 404c is prevented from reducing the Q value of the pattern inductance or the chip inductance. This prevention is important for keeping selectivity and reducing loss of the tuning filter when the tuning filter is formed using the inductance. Thus, in the configuration of embodiment 9, a good filter can be obtained even when the pattern inductance or the chip inductance is used as the inductance.

The high frequency receiver of the present invention has the following elements:

an input terminal for receiving a high frequency signal;

a filter connected to the input terminal;

a mixer of which one input part is connected to an output part of the filter and the other input part is connected to an output part of a frequency-variable local oscillator; and an output terminal connected to an output part of the mixer.

The mixer is an image rejection mixer. The filter has a moderated damping characteristic in frequency where the image rejection mixer reduces the image.

Since the image rejection mixer reduces the image, a damping amount of the image with respect to the frequency may be reduced in the filter. A high-performance filter is not required, so that the inexpensive high frequency receiver can be advantageously provided.

The high frequency receiver of the single conversion type of the upper heterodyne type for receiving a signal having a broadband frequency is interfered by many signals existing in the receiving band. Therefore, image interference generated by a combination of the many signals must be suppressed. In the high frequency receiver of the present invention, an image suppressing characteristic by an IRM and a damping characteristic by a filter suppress the image in response to the received frequency and prevent the image interference. The damping characteristic is used for damping an image itself or a signal for generating the image.

The damping amount by the filter may be small, so that a complex configuration having three tuning circuits is not required differently from a conventional filter, the filter can be replaced by a fixed filter or the like, and the number of tuning circuits can be decreased. The number of components constituting the filter can be therefore reduced, so that an inexpensive and small high frequency receiver can be provided.

When tuning circuits are used, Q values of the tuning circuits and a matching property between them vary with respect to the frequency. However, the number of tuning circuits can be decreased in the present invention, so that this variation can be reduced. Variation of the gain or waveform of every channel can be therefore reduced, and the reduction is useful especially when signals of a digital television broadcast are received.

Reducing the tuning circuits can decrease the number of adjusting places and time for adjusting the high frequency receiver, so that productivity is extremely improved and an inexpensive high frequency receiver can be provided.

Reducing the tuning circuits can decrease coupling between coils constituting the tuning circuits, so that the shied of the shield case can be simplified and an inexpensive high frequency receiver can be realized.

What is claimed is:

1. A single conversion type high frequency receiver comprising:
   an input terminal for receiving a high frequency signal;
   a filter coupled to said input terminal;
   an image rejection mixer having an input part coupled to an output part of said filter; and
   an output terminal coupled to an output part of said image rejection mixer,
   wherein said image rejection mixer comprises:
      a variable frequency oscillator operable to output a signal;
      a first phase shifter coupled to an output part of said variable frequency oscillator;
      a first mixer for mixing the output of said filter and an output of said variable frequency oscillator;
      a second mixer for mixing the output of said filter and an output of said first phase shifter; and
      a second phase shifter coupled to an output part of said first mixer,
   wherein said image rejection mixer is operable to generate a signal having an intermediate frequency, the intermediate frequency being a difference between a frequency of the signal output by said variable frequency oscillator and a frequency of the high frequency signal received by said input terminal;
   wherein said filter is operable to pass a frequency lower than a predetermined cutoff frequency; and
   wherein the predetermined cutoff frequency is a frequency not higher than a frequency higher than a third harmonic frequency of said variable frequency oscillator by approximately the intermediate frequency.

2. A high frequency receiver according to claim 1, further comprising a high frequency amplifier disposed between said filter and said image rejection mixer.

3. A high frequency receiver according to claim 2, wherein
   said high frequency amplifier and said image rejection mixer are formed of a balanced circuit, and
   said high frequency amplifier and said image rejection mixer are inter-coupled in balance.

4. A high frequency receiver according to claim 2, wherein said high frequency amplifier is directly coupled to said image rejection mixer.

5. A high frequency receiver according to claim 2, wherein said high frequency amplifier includes a bipolar transistor.

6. A high frequency receiver according to claim 2, wherein both of said high frequency amplifier and said image rejection mixer include a transistor formed by an identical process, and
   wherein said transistor is stored in one integrated circuit.

7. A high frequency receiver according to claim 6, wherein said high frequency amplifier is directly coupled to said image rejection mixer.

8. A high frequency receiver according to claim 2, wherein said high frequency amplifier and said image rejection mixer include a bipolar transistor.

9. A high frequency receiver according to claim 1, wherein said filter is composed of a first filter and a second filter, and
   wherein a high frequency amplifier is disposed between said first filter and said second filter.

10. A high frequency receiver according to claim 9, wherein said first filter is formed of a single tuning circuit.

11. A high frequency receiver according to claim 10, wherein said second filter is a fixed filter.

12. A high frequency receiver according to claim 11, wherein said second filter is a high-pass filter.

13. A high frequency receiver according to claim 11, wherein said second filter is a low-pass filter.

14. A high frequency receiver according to claim 11, wherein said second filter is a band-pass filter.

15. A high frequency receiver according to claim 11, wherein said second filter includes a plurality of filters, each of the plurality of filters having a different cutoff frequency, and
   wherein one of the plurality of filters can be selected in response to a received frequency.

16. A high frequency receiver according to claim 1, wherein said high frequency receiver is used for receiving a television broadcast,
   wherein said input terminal receives a high frequency signal of the television broadcast as the high frequency signal,
   wherein said filter passes a frequency in the received frequency band,
   wherein said high frequency receiver comprises:
      a high frequency amplifier interposed between said input terminal and said filter; and a switch having a common terminal that is disposed between said high frequency amplifier and said filter and is coupled to an output part of said high frequency amplifier, wherein a first output part of said switch is coupled to said filter, and a second output part of said switch is coupled to an input part of said image rejection mixer, and wherein said switch is coupled to said second output part when a frequency not lower than the cutoff frequency of said filter is received.

17. A high frequency receiver according to claim 1, wherein a reduction amount of an image by said image rejection mixer is increased with respect to a specific channel having a small damping amount of a passing characteristic of said filter.

18. A high frequency receiver according to claim 1, wherein said filter has a variable image trap capable of damping image frequency in response to at least a received channel.

19. A high frequency receiver according to claim 1, wherein said filter includes a first filter for passing a frequency in a VHF low band and a second filter for passing a frequency in a VHF high band, said second filter being disposed in parallel with said first filter, a variable image trap is coupled to said first filter, and said variable image trap damps image frequency of a received channel when the VHF low band is received, and damps frequency of the VHF low band when the VHF high band is received.

20. A high frequency receiver according to claim 1, further comprising a high frequency amplifier disposed between said input terminal and said filter.

21. A high frequency receiver according to claim 20, wherein said input terminal is directly coupled to said high frequency amplifier.

22. A high frequency receiver according to claim 1, wherein said filter is formed of a double tuning circuit.

23. A high frequency receiver according to claim 1, wherein said filter is formed of a fixed filter.

24. A high frequency receiver according to claim 1, wherein said filter has a fixed trap for damping image frequency in a VHF low band.

25. A high frequency receiver according to claim 24, wherein a trap frequency of the fixed trap is substantially equal to an image frequency occurring when a frequency of a substantially central channel of the VHF low band is received.

26. A high frequency receiver according to claim 1, wherein the predetermined cutoff frequency is higher than the third harmonic frequency of said variable frequency oscillator by approximately the intermediate frequency.

* * * * *